(12) United States Patent
Mariappasamy et al.

(10) Patent No.: US 11,403,443 B2
(45) Date of Patent: Aug. 2, 2022

(54) AUTOMATED PROCESS FOR PARAMETRIC MODELING

(71) Applicant: Detroit Engineered Products, Inc., Troy, MI (US)

(72) Inventors: Radhakrishnan Mariappasamy, Troy, MI (US); Senthil Kumar Velu, Chennai (IN)

(73) Assignee: DETROIT ENGINEERED PRODUCTS, INC., Troy, MI (US)

( * ) Notice: Subject to any disclaimer, the term of this patent is extended or adjusted under 35 U.S.C. 154(b) by 546 days.

(21) Appl. No.: 16/124,797

(22) Filed: Sep. 7, 2018

(65) Prior Publication Data
US 2019/0073438 A1  Mar. 7, 2019

Related U.S. Application Data

(60) Provisional application No. 62/555,349, filed on Sep. 7, 2017.

(51) Int. Cl.
*G06F 30/23* (2020.01)
*G06F 3/04847* (2022.01)
(Continued)

(52) U.S. Cl.
CPC .......... *G06F 30/23* (2020.01); *G06F 3/04847* (2013.01); *G06F 30/17* (2020.01);
(Continued)

(58) Field of Classification Search
CPC ...... G06F 30/23; G06F 30/17; G06F 3/04847; G06F 30/25; G06F 30/367; G06F 2111/00; G06F 30/398; G06F 2119/22; G06F 30/12; G06T 19/20; G06T 17/20; G06T 2219/2021
See application file for complete search history.

(56) References Cited

U.S. PATENT DOCUMENTS 7,079,990 B2 * 7/2006 Haller .............. G05B 19/41805
703/2
7,219,043 B2 * 5/2007 Rebello .............. G05B 19/4097
703/7

(Continued)

OTHER PUBLICATIONS

Rudig, Christian et al., "Efficient and reconfigurable design with 3D parametrics,"ASME/IFToMM International Conference on Reconfigurable Mechanisms and Robots, pp. 715-724 (Year: 2009).*

(Continued)

*Primary Examiner* — Steven W Crabb
(74) *Attorney, Agent, or Firm* — Inskeep IP Group, Inc.

(57) ABSTRACT

An automated process for parametric modeling for automating the parametrization process to build a parametric model from CAD or un-parameterized CAE data. The automated process for parametric modeling generally includes automation of the parameterization process to build a parameterized computer-aided-engineering model from computer-aided-design data. The automated process may include a given set of rules and templates for geometric feature identification. The automated process is adapted to automatically generate all parameters necessary for efficient modifications to various elements, such as geometric features, of the parametric model.

16 Claims, 23 Drawing Sheets

(51) Int. Cl.
*G06T 19/20* (2011.01)
*G06T 17/20* (2006.01)
*G06F 30/17* (2020.01)

(52) U.S. Cl.
CPC .............. *G06T 17/20* (2013.01); *G06T 19/20* (2013.01); *G06T 2219/2021* (2013.01)

(56) References Cited

U.S. PATENT DOCUMENTS

| | | | | |
|---|---|---|---|---|
| 2007/0198230 | A1* | 8/2007 | Wang | G06F 30/15 |
| | | | | 703/1 |
| 2007/0285425 | A1* | 12/2007 | Bae | G06F 30/00 |
| | | | | 345/427 |
| 2010/0292963 | A1 | 11/2010 | Schroeder | |
| 2011/0153052 | A1* | 6/2011 | Pettibone | G05B 19/4097 |
| | | | | 700/98 |
| 2012/0109591 | A1* | 5/2012 | Thompson | G06F 30/00 |
| | | | | 703/1 |
| 2016/0246899 | A1* | 8/2016 | Hirschtick | G06F 30/17 |

OTHER PUBLICATIONS

Gujarathi, G.P. et al., "Parametric CAD/CAE integration using a common data model," Journal of Manufacturing Systems 30 pp. 118-132 (Year: 2011).*
PCT International Search Report and Written Opinion for PCT/US18/49975; dated Dec. 4, 2018.
Preliminary Report on Patentability for PCT/US2018/49975; dated Mar. 19, 2020.

* cited by examiner

FIG. 16A
| Parameters | | | |
|---|---|---|---|
| ● Fillet Radius Change | Select Fillet Component | CAD Surfaces | Execute |
| ○ Tube Diameter Change | Deformable Zone Width [%] | 0.20 | Review |
| ○ Rib Height Change | Range of Radius Change [%] | Min -10  Max 10 | Return |
| ○ Rib Thickness Change | Parameter Name | Fillet Radius Change 1 | |
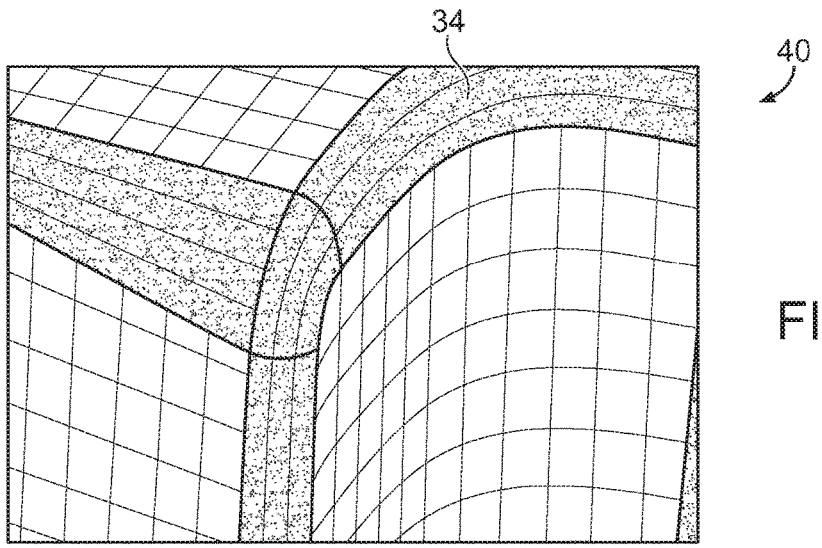
FIG. 16B
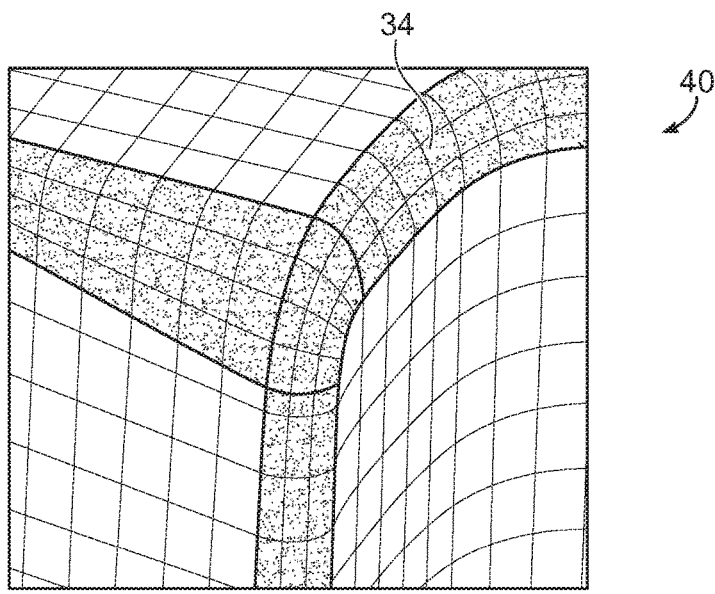
FIG. 16C

Input parameters

| | | Parameters | Name | Min | Max |
|---|---|---|---|---|---|
| Flange Angle | 18 | ☑ | Width Individually ▾ | Width | -15 | 15 |
| Max. Flange Width | 30 | ☑ | Height Individually ▾ | Height | -15 | 15 |
| ☑ Width Transition | 35 | ☑ | Flange Individually ▾ | Flange | -15 | 0 |
| ☑ Depth Transition | 25 | ☑ | Weld Parameter | Weld_param | -15 | 15 |

Create Parameters    Review Parameters

Return

FIG. 25

Input Parameters

| | | Parameters | Name | Min | Max |
|---|---|---|---|---|---|
| Flange Angle | 18 | ☑ | Width Individually ▾ | Width | -15 | 15 |
| Max Flange Width | 30.0 | ☑ | Flange Individually ▾ | Flange | -15 | 0 |
| Height of Flange Region | 7 | ☑ | Height Parameter | Height | -15 | 15 |
| ☑ Width Transition | 25 | ☑ | Weld Parameter | Weld_param | -15 | 15 |
| ☑ Depth Transition | 25 | | | | | |

Morph Controls

Member Only ▾

Create Parameters

AUTOMATED PROCESS FOR PARAMETRIC MODELING

CROSS REFERENCE TO RELATED APPLICATIONS

I hereby claim benefit under Title 35, United States Code, Section 119(e) of United States provisional patent application Ser. No. 62/555,349 filed Sep. 7, 2017. The 62/555,349 application is hereby incorporated by reference into this application.

STATEMENT REGARDING FEDERALLY SPONSORED RESEARCH OR DEVELOPMENT

Not applicable to this application.

BACKGROUND

Field

Example embodiments in general relate to an automated process for parametric modeling for automating the parametrization process to build a parametric model from CAD data.

Related Art

Any discussion of the related art throughout the specification should in no way be considered as an admission that such related art is widely known or forms part of common general knowledge in the field.

Parametric modeling is useful in design of a wide range of items, including mechanical items such as automobiles and automobile parts, structures such as buildings and walls, among others. By parameterizing a model, a designer may identify various characteristics of the model that may be useful in design, such as points of weakness.

Parameterization of design models has long been a time-intensive process. In the past, a step-by-step process of manual entries is required to convert CAD data into a parameterized finite element model. These parameterization steps take up valuable design time and can be susceptible to mistakes or omissions by the designer due to their time-intensive attributes.

SUMMARY

An example embodiment is directed to an automated process for parametric modeling. The automated process for parametric modeling includes automation of the parameterization process to build a parameterized computer-aided-engineering model from computer-aided-design data. The automated process may include a given set of rules and templates for geometric feature identification. The automated process is adapted to automatically generate all parameters necessary for efficient modifications to various elements, such as geometric features, of the parametric model.

There has thus been outlined, rather broadly, some of the embodiments of the automated process for parametric modeling in order that the detailed description thereof may be better understood, and in order that the present contribution to the art may be better appreciated. There are additional embodiments of the automated process for parametric modeling that will be described hereinafter and that will form the subject matter of the claims appended hereto. In this respect, before explaining at least one embodiment of the automated process for parametric modeling in detail, it is to be understood that the automated process for parametric modeling is not limited in its application to the details of construction or to the arrangements of the components set forth in the following description or illustrated in the drawings. The automated process for parametric modeling is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Example embodiments will become more fully understood from the detailed description given herein below and the accompanying drawings, wherein like elements are represented by like reference characters, which are given by way of illustration only and thus are not limitative of the example embodiments herein.

FIG. 16A is a view of an exemplary interface for use with an automated process for parametric modeling in accordance with an example embodiment.

FIG. 16B is a perspective view of a parametric model prior to modification by an automated process for parametric modeling in accordance with an example embodiment.

FIG. 16C is a perspective view of a parametric model after modification by automated process for parametric modeling in accordance with an example embodiment.

FIG. 18 is a view of an exemplary interface for use with an automated process for parametric modeling in accordance with an example embodiment.

FIG. 19 is a view of an exemplary interface for use with an automated process for parametric modeling in accordance with an example embodiment.

FIG. 20 is a view of an exemplary interface for use with an automated process for parametric modeling in accordance with an example embodiment.

FIG. 21 is a view of an exemplary interface for use with an automated process for parametric modeling in accordance with an example embodiment.

FIG. 24 is a view of an exemplary interface for use with an automated process for parametric modeling in accordance with an example embodiment.

FIG. 25 is a view of an exemplary interface for use with an automated process for parametric modeling in accordance with an example embodiment.

DETAILED DESCRIPTION

A. Introduction

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein. The present invention may be operated as a computer program installed upon a computer-aided-design computer 100 (i.e. a computer used for computer-aided-design, such as with a CAD program as known in the arts), via a website or other system.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs), DVDs (digital video discs), flash drives, USB drives and computer instruction signals embodied in a transmission medium (with or without a carrier wave upon which the signals are modulated). For example, the transmission medium may include a communications network, such as the Internet.

B. Exemplary Computer System.

Figure 1:
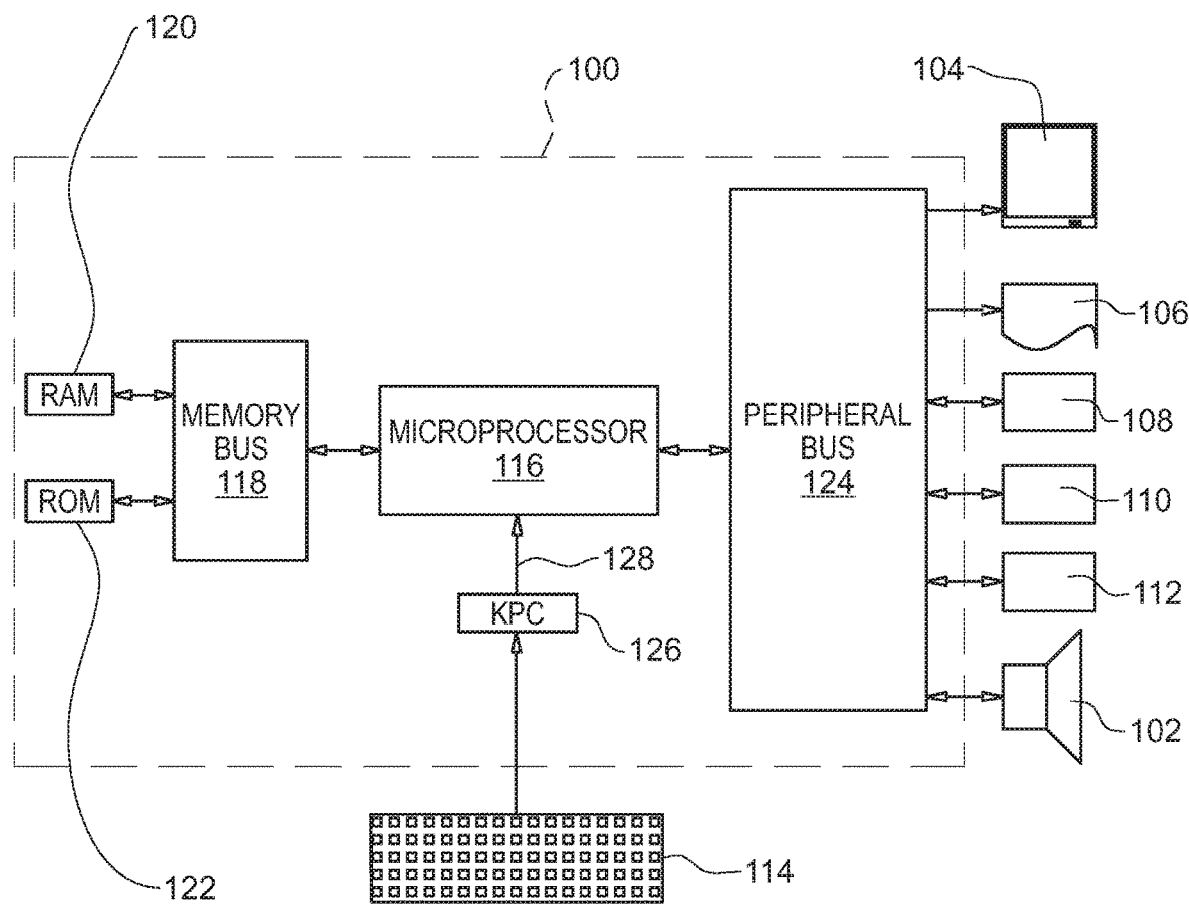
FIG. 1 is a block diagram of an exemplary computer system of an automated process for parametric modeling in accordance with an example embodiment.

FIG. 1 is a block diagram of an exemplary computer system 100 for practicing the various aspects of the present invention. The computer system 100 includes a display screen (or monitor) 104, a printer 106, a floppy disk drive 108, a hard disk drive 110, a network interface 112, and a keyboard 114. The computer system 100 also includes a microprocessor 116, a memory bus 118, random access memory (RAM) 120, read only memory (ROM) 122, a peripheral bus 124, and a keyboard controller 126. Computer system 100 can be a personal computer (such as an APPLE computer, an IBM computer, or one of the compatibles thereof), a workstation computer (such as a SUN MICROSYSTEMS or HEWLETT-PACKARD workstation), or various other types of computers. It can be appreciated that the computer system 100 may be comprised of various other electronic devices including but not limited to mobile phones, telephones, personal digital assistants (PDAs), handheld wireless devices, two-way radios, smart phones, communicators, video viewing units, television units, television receivers, cable television receivers, pagers, communication devices, and digital satellite receiver units.

The microprocessor 116 is a general-purpose digital processor that controls the operation of the computer system 100. Microprocessor 116 can be a single-chip processor or implemented with multiple components. Using instructions retrieved from memory, microprocessor 116 controls the reception and manipulations of input data and the output and display of data on output devices.

The memory bus 118 is utilized by the microprocessor 116 to access the RAM 120 and the ROM 122. RAM 120 is used by microprocessor 116 as a general storage area and as scratch-pad memory, and can also be used to store input data and processed data. ROM 122 can be used to store instructions or program code followed by microprocessor 116 as well as other data.

Peripheral bus 124 is used to access the input, output and storage devices used by the computer system 100. In the described embodiment(s), these devices include a display screen 104, a printer device 106, a floppy disk drive 108, a hard disk drive 110, and a network interface 112. A keyboard controller 126 is used to receive input from the keyboard 114 and send decoded symbols for each pressed key to microprocessor 116 over bus 128.

The display screen 104 is an output device that displays images of data provided by the microprocessor 116 via the peripheral bus 124 or provided by other components in the computer system 100. The printer device 106 when operating as a printer provides an image on a sheet of paper or a similar surface. Other output devices such as a plotter, typesetter, etc. can be utilized in place of, or in addition to, the printer device 106.

The floppy disk drive 108 and the hard disk drive 110 can be utilized to store various types of data. The floppy disk drive 108 facilitates transporting such data to other computer systems, and the hard disk drive 110 permits fast access to large amounts of stored data.

The microprocessor 116 together with an operating system operate to execute computer code and produce and use data. The computer code and data may reside on RAM 120, ROM 122, or hard disk drive 110. The computer code and data can also reside on a removable program medium and loaded or installed onto computer system 100 when needed. Removable program mediums include, for example, CD-ROM, PC-CARD, floppy disk and magnetic tape.

The network interface circuit 112 is utilized to send and receive data over a network connected to other computer systems. An interface card or similar device and appropriate software implemented by microprocessor 116 can be utilized to connect the computer system 100 to an existing network and transfer data according to standard protocols.

The keyboard 114 is used by a user to input commands and other instructions to the computer system 100. Other types of user input devices can also be used in conjunction with the present invention. For example, pointing devices such as a computer mouse, a track ball, a stylus, or a tablet to manipulate a pointer on a screen of the computer system 100.

The present invention can also be embodied as computer readable code on a computer readable medium. The computer readable medium is any data storage device that can store data which can be thereafter be read by a computer system. Examples of the computer readable medium include read-only memory, random-access memory, magnetic data storage devices such as diskettes, and optical data storage devices such as CD-ROMs. The computer readable medium can also be distributed over a network coupled computer systems so that the computer readable code is stored and executed in a distributed fashion.

The present invention may be embodied within various languages and technologies such as but not limited to JAVA, JAVASCRIPT, JSCRIPT, WMLSCRIPT, ACTIVEX, CGI, scripts, plug-ins, BASIC, VISUAL BASIC, C, C++, COBOL, FORTRAN, ADA, HTML, DHTML, XML, SGML, WML, HDML, FLASH, SHOCKWAVE, GIF, JPEG, ADOBE ACROBAT, PDF, MICROSOFT WORD, and PASCAL. The present invention may be operated upon various operating systems such as but not limited to UNIX, MACINTOSH, LINUX, WINDOWS, PALMOS, EPOC, WINDOWS CE, FLEXOS, OS/9, and JAVAOS.

B. Exemplary Global Computer Network

The global computer network (e.g. Internet) is an exemplary communications network which may be utilized in combination with the present invention. The Internet is basically comprised of a "global computer network." A plurality of computer systems 100 around the world are in communication with one another via this global computer network and are able to transmit various types of data between one another. The communications between the computer systems may be accomplished via various methods such as but not limited to wireless, Ethernet, cable, direct connection, telephone lines, and satellite. One or more web servers typically provide the data to the computer systems connected via the Internet.

The present invention may also be utilized upon global computer networks, local area networks (LAN), wide area networks (WAN), campus area networks (CAN), metropolitan-area networks (MAN), and home area networks (HAN). Various protocols may be utilized by the electronic devices for communications such as but not limited to HTTP, SMTP, FTP and WAP (Wireless Application Protocol). The present invention may be implemented upon various wireless networks such as but not limited to CDPD, CDMA, GSM, PDC, PHS, TDMA, FLEX, REFLEX, IDEN, TETRA, DECT, DATATAC, and MOBITEX. The present invention may also be utilized with online services and internet service providers such as AMERICA ONLINE (AOL), COMPUSERVE, WEBTV, and MSN INTERNET SERVICES. The present invention preferably utilizes the Internet for transmitting data, however it can be appreciated that as future technologies are created that various aspects of the invention may be practiced with these improved technologies.

The present invention is preferably embodied within a software application installed upon the computer-aided-design computer 100. Any type of computer 100 known in the art may be utilized to practice the present invention, including personal computers, laptop computers, tablet computers, smart phones and the like. The present invention may also be embodied in various other manners such as but not limited to a central server computer or a web server that performs all functionality server-side and merely provide the results of the morphed CAD data to the computer 100.

C. CAD Files.

The present invention is adapted to automatically and efficiently parameterize CAD data into a parameterized finite element model 24. The CAD data may be embodied in various types of files known in the art to store CAD data to assist with computer-aided-design. Various file formats known in the art may be utilized, such as .STEP, .IGS, .X_T, .X_B, .PRT, .CATPART, among others. The CAD data may have been previously compiled or prepared using any number of CAD software programs known in the art, such as AUTOCAD as offered by Autodesk, Inc. The CAD data may include meshing, or meshing may be added as discussed herein.

The CAD data may include one or more elements 30, such as parts or assemblies of parts. It should be appreciated that the methods and systems described herein may be utilized to parameterize any type of design which is stored within a CAD data file.

The CAD data file may incorporate a CAD element model 20 which may be accessed, meshed and parameterized by the systems and methods described herein. The various elements 30 such as geometric features of the CAD element model 20 may be carried forward into a parametrized model automatically by the computer system 100.

The CAD data file may be in a computer readable file format and may be available directly from the computer or via downloading through a global computer network. In some embodiments, the CAD data file may be retained on a remote server and the functionality of the present invention may be performed either by the local computer or by the remote server directly, with the results being transmitted to the local computer after processing.

D. Operation of the Present Invention.

The methods and systems described herein allow automation of the parameterization process to builds a parametric model 24 either directly from CAD data or from an un-parameterized CAE model based on a set of rules 52 and element 30 (geometric feature) identification templates 54 which automatically generate all necessary parameters 56. The systems and methods described herein may utilize a computer system 100 which receives either CAD data of existing parts and/or assemblies or un-parameterized element models 20. A set of templates 54 for geometric feature identification and a set of rules 52 may be utilized by the computer system 100 to automatically output a parametric model 24.

The computer system 100 may start with either a CAD model or an un-parameterized CAE model and automatically create a morph set. Parameter 56 directions may be set and then parameters 56 may be saved. The parametric model 24 may then be automatically created and saved for future design needs.

Morph set creation may be automated by the computer system 100 using the methods and systems described herein. In an exemplary embodiment, an element model 20 may be meshed into a meshed element model 22. During the meshing process, elements 30 such as geometric features, including but not limited to fillets 34, holes/tubes 32, walls, ribs 36, and the like may be detected automatically and meshed as per the meshing templates 54. Properties of the geometric features of the underlying element model 20 may be passed on to the meshed element model 22.

Using the inherited properties, morph sets may be created on the mesh automatically. If the start point of the process is an un-parameterized CAE model, then special rules 52 may be defined to create control blocks automatically. The rules 52 take into account the geometric features of the CAE model such as cross-sectional details, connections such as welds, parts surrounding the area of interest, and the like. The computer system 100 may utilize the created control blocks to automatically create the morph sets.

Another exemplary category of rules 52 may be based on finite element analysis results such as stress contours, strain energy contours, and the like. In this category, morph sets may be automatically created based on the stress/strain energy and other output response gradients in regions where high magnitudes of such responses are seen.

Depending on the type of parameter to be created by the computer system 100, the corresponding control nodes may be automatically identified by the computer system 100. This allows the control nodes to be moved in a specified direction by a specified distance by the computer system 100 without undue burden on a user. Since the process is fast and highly automated, early stage design changes and development time in several industries can be greatly reduced. Minimal training may thus be required for setting up the parameters to allow for more efficient design processes.

The systems and methods described herein may be utilized for a wide range of utilities. By way of example, the systems and methods described herein may be utilized for the creation of shape parameters 56 on CAE models of castings such as but not limited to fillet radius change, rib height change, wall thickness change, hole diameter change, rib orientation change, rib location change, and the like.

As a further example, the systems and methods described herein may be utilized to create shape parameters 56 on CAE models of stamped assemblies such as cross-section width, cross-section height, flange width, orientation of elements, location change of elements, and the like.

As yet another example, the systems and methods described herein may be utilized to create non-shape parameters such as spot weld pitch, seam weld line length, number of seam welds in a given region, and the like.

The methods and systems described herein provide a comprehensive computer-aided-engineering model parameterization engine 50 which may benefit from a broad range of categories of parameters 56 capable of use at all stages of development. As discussed herein, categories of parameters 56 which may be applied automatically with little input from a user by the methods and systems described herein may include gauge, shape, sections, spot weld pitch, seam-weld-spacing, adhesive length, topology (member repositioning), features (number of holes, ribs, bulkheads, crush-initiators etc. in a given space) and other general parameters.

The systems and methods described herein may be utilized in a wide range of industries that utilize mechanical design. The automated parametric processes described herein may be utilized in connection with industries such as but not limited to automotive, aerospace, heavy equipment, consumer goods, oil and gas, construction, etc. The methods and systems described herein may be utilized for the mechanical design of parts and/or assemblies.

Utilizing the methods and systems described herein, regular finite element or computational fluid dynamics models may be converted to intelligent parametric models 24. The parameters 56 may be exercised as one-time execution or linked to Design of Experiments (DOE) and/or Multi-Disciplinary Optimization (MDO) schemes. Multiple runnable models may be generated automatically using the systems and methods described herein by exercising the parametric models 24.

In an exemplary embodiment, a method for automatically generating a parametric model 24 by a computer system 100 may comprise first receiving an element model 20 comprised of a plurality of elements 30 such as geometric features. A mesh may be applied to the element model 20 so as to form a meshed element model 22. One or more elements 30 such as geometric features of the element model 20 may be identified by the computer system 100. A parametric model 24 may be automatically created from the element model 20 based on the one or more geometric features of the element model 20, as well as rules 52 which are discussed herein.

The computer system 100 may receive a selection of one or more of the geometric features of the parametric model 24. The computer system 100 may also receive one or more parameters 56 for modifying the one or more geometric features that have been selected in the previous step. The computer system 100 may then modify the one or more geometric features based on the one or more parameters 56.

The element model 20 may comprise a computer-aided-design model and the parametric model 24 may comprise a parameterized finite element model. The computer system 100 may be adapted to display an interface 40 for modifying the one or more geometric features. In some embodiments, the interface 40 may comprise a slider 44 which is adapted to adjust the parameters 56 being applied to modify the one or more geometric features of the parametric model 24.

The computer system 100 may receive, store, and/or access one or more rules 52 for identifying the one or more geometric features of the element model 20. The rules 52 may be accessed remotely, such as via a communications network, or locally, such as from a hard disk drive of the computer system 100. The one or more rules 52 may comprise identifying one or more of the geometric features which exhibit a characteristic, such as a high stress load. In other words, the computer system 100 may be adapted to automatically highlight or select any geometric features of the parametric model 24 which have a high stress load so that parameters 56 may be modified as needed. The one or more parameters 56 may be selected from a group consisting of width, depth, length, thickness, radius, diameter, and height.

In another exemplary embodiment, a method for automatically generating a parametric model 24 by a computer system 100 may comprise receiving an element model 20 comprising a plurality of elements 30, applying a mesh to the element model 20 to create a meshed element model 22, receiving one or more rules 52 for identifying one or more geometric features of the element model 20, identifying the one or more geometric features of the element model 20 based on the one or more rules 52, and automatically creating a parametric model 24 from the element model 20 based on the one or more geometric features of the element model 20.

The computer system 100 may receive a selection of one or more of the geometric features of the parametric model 24 and one or more parameters 56 for modifying the one or more geometric features that have been selected. The computer system 100 may then modify the one or more geometric features based on the one or more parameters 56. The geometric features may comprise various parts, surfaces, or the like in an element model 20, such as but not limited to a hole/tube 32, a fillet 34, a rib 36, and a flange 38.

An exemplary embodiment of a method of using the present invention may comprise receiving an element model 20 which is comprised of a plurality of elements 30. The element model 20 may be included in a CAD data file or other type of file which is loaded by the computer system 100. The element model 20 may comprise a meshed element model 22, or the computer system 100 may itself apply a mesh to the element model 20 to create the meshed element model 22.

The computer system 100 may be adapted to generate parametric meshes during the meshing process itself. A baseline model created by the methods and systems described herein is automatically a parametric model 24, saving the time and effort of parameterization which is typically done separately. The parameterization may be driven by element 30 recognition and user-provided rules 52 and templates 54. The methods and systems described herein may be utilized to create morph sets as part of the parametrization process so that the user does not need to create morph sets. Morphing may be freeform or control block based.

Automation of the parameterization process may be accomplished using two categories of criteria: geometric features and rules-based. The computer system 100 may be adapted to access various rules 52 and templates 54 that may be defined by the user single or limited times for repeated usage in parameterizing multiple models.

All of the original feature details of the non-parametric part geometry may be carried forward into the parametric model 24. The computer system 100 may be adapted to identify one or more elements 30 such as geometric features of the element model 20. A wide range of geometric features capable of being incorporated in a parameterized finite element model 24 or computational fluid model may be identified using the methods and systems described herein. By way of example and without limitation, geometric features of the model 20 which may be automatically detected or carried forward by the computer system 100 as part of the parametrization process may include holes 32, fillets 34, ribs 36, welds, flanges 38, and the like.

The computer system 100 may utilize the detected geometric features of the model 20 to identify various surfaces of the geometric features. For example, in the case of a fillet 34, the computer system 100 may be adapted to identify four-sided regions, fillet 34 edges, curves, and the like. With the surfaces of the geometric features being identified, the computer system 100 may automatically create parameters 56 so as to parametrize the model.

Rules 52 may also be set based on surrounding parts or features. For example, the computer system 100 may detect high stress regions of the parametric model 24. A rule 52 may be set and access by the computer system 100 (either locally or remotely) to automatically select surfaces or features exhibiting high stresses. Another example of a rule 52 which may be set comprises a rule 52 based on flange interaction between parts or features.

By automatically selecting surfaces based on pre-set rules 52, the computer system 100 may more efficiently analyze and allow adjustment of various features of the parametric model 24. For example, a rib 36 exhibiting high stress may be thickened. By way of further example, the width and depth change of a stamped member may be accomplished more conveniently based on a rule 52. The computer system 100 may identify the flange 38 and a rule 52 may be set based on range, defining what is identified as a vertical wall and what is identified as a horizontal wall.

The computer system 100 may be adapted to automatically create a parametric model 24 from the element model 20 based on the one or more geometric features of the element model 20. Types of parameters 56 which may be incorporated include but are not limited to shape parameters 56, structural (gauge/material) parameters 56, feature parameters 56, macro parameters 56, topology parameters 56, and general text parameters 56. The automatic parameterization of the element model 20 performed by the computer system 100 increases efficiency and prevents the requirement for a user to parameterize the model 20 manually and separately for each parameter 56.

The computer system 100 may be adapted to receive a selection of one or more of the geometric features of the parametric model 24 to be modified. The computer system 100 may receive one or more parameters 56 for modifying the one or more geometric features that have been selected.

For example, a rib 36 showing high stress may be desired to be strengthened by thickening the rib 36.

An interface may be displayed which allows the user to select from between a range of parameter 56 modifications to be applied to the model 20. By way of example, the interface may comprise a slider 44 which is adapted to modify the one or more geometric features of the parametric model based on user input. For example, if the slider 44 is moved in a first direction, the thickness of a rib 36 may be reduced and, if the slider 44 is moved in a second direction, the thickness of a rib 36 may be increased.

Figure 2:
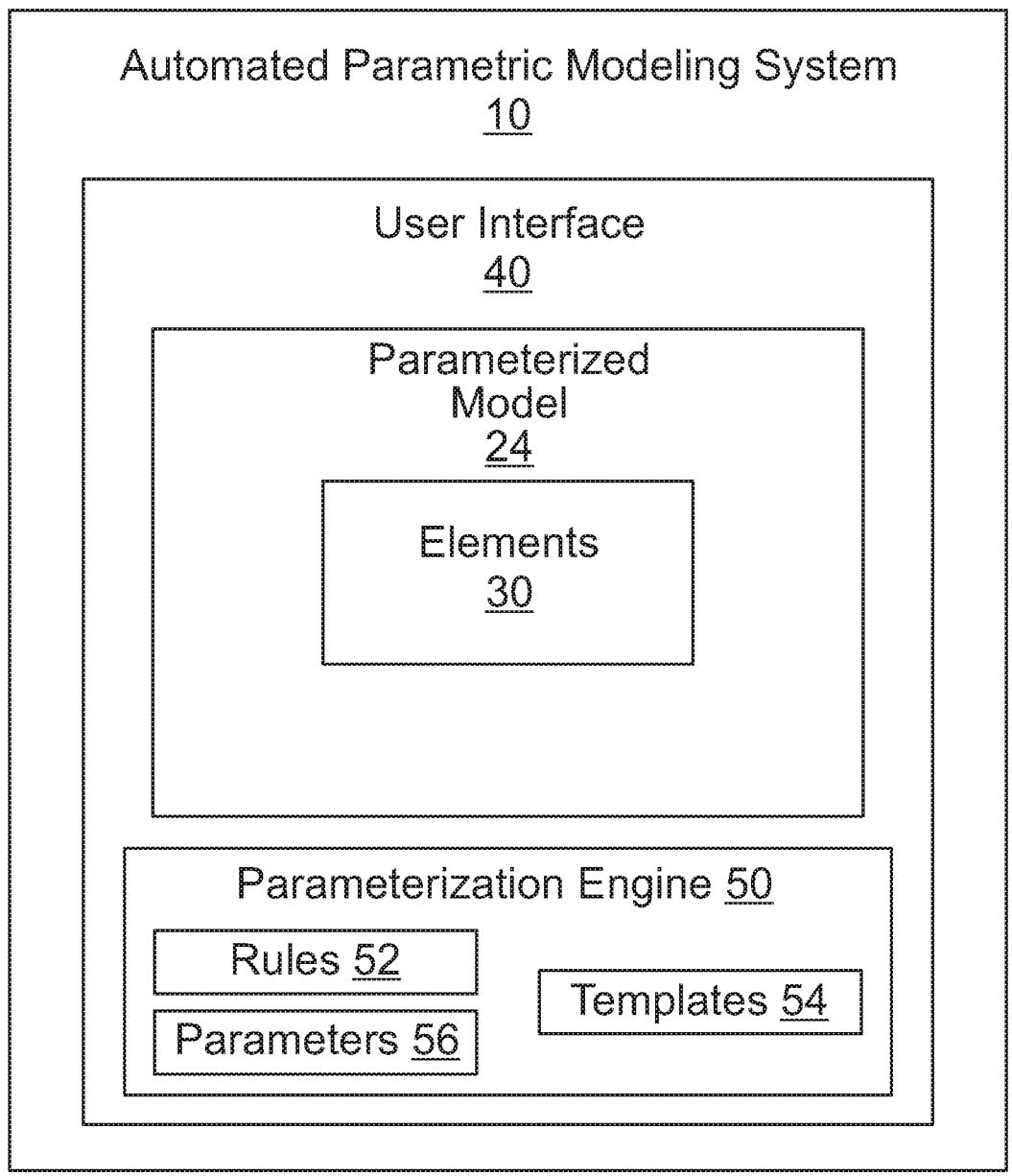
FIG. 2 is a block diagram of an automated process for parametric modeling in accordance with an example embodiment.

FIG. 2 is a block diagram of an exemplary software architecture of a computer system 100 adapted to automatically generate a parametric model 24 so as to improve the efficiency of the computer system 100 when parameterizing an element model 20. As shown in FIG. 2, the automated parametric modeling system 10 may comprise a user interface 40 which shows a parametric model 24 including a plurality of elements 30. A parameterization engine 50 may be utilized to automatically parameterize the parametric model 24; with the parameterization engine 50 comprising one or more rules 52, one or more templates 54 for identifying various elements 30 such as geometric features, and one or more parameters 56 which may be modified in the parametric model 24.

Figure 3:
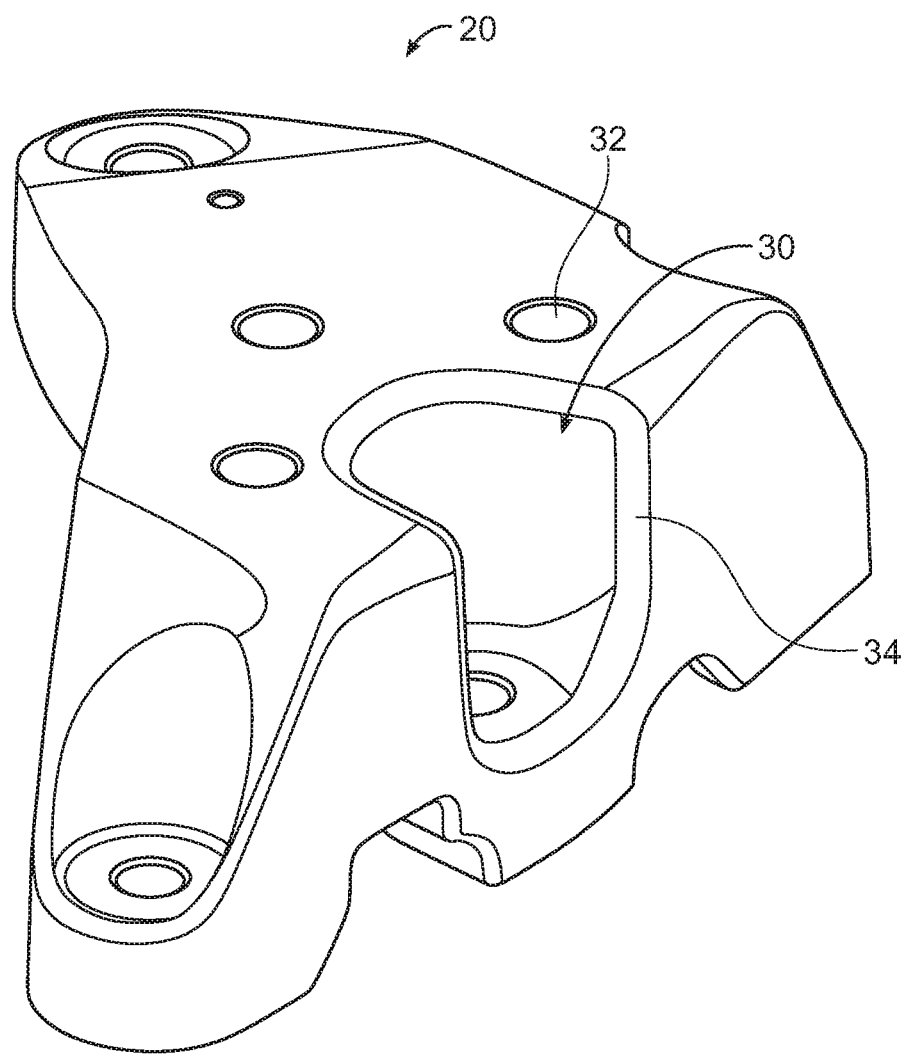
FIG. 3 is a perspective view of an element model including elements of an automated process for parametric modeling in accordance with an example embodiment.

FIG. 3 illustrates an exemplary view of an element model 20 which may be automatically parameterized using the methods and systems described herein. While FIG. 3 illustrates an element model 20 showing a single part, it should be appreciated that the element model 20 may comprise an assembly of parts in some embodiments, such as an entire vehicle. In the exemplary embodiment of FIG. 3, a plurality of elements 30 are shown on the element model 20, including holes and a fillet 34.

Figure 4:
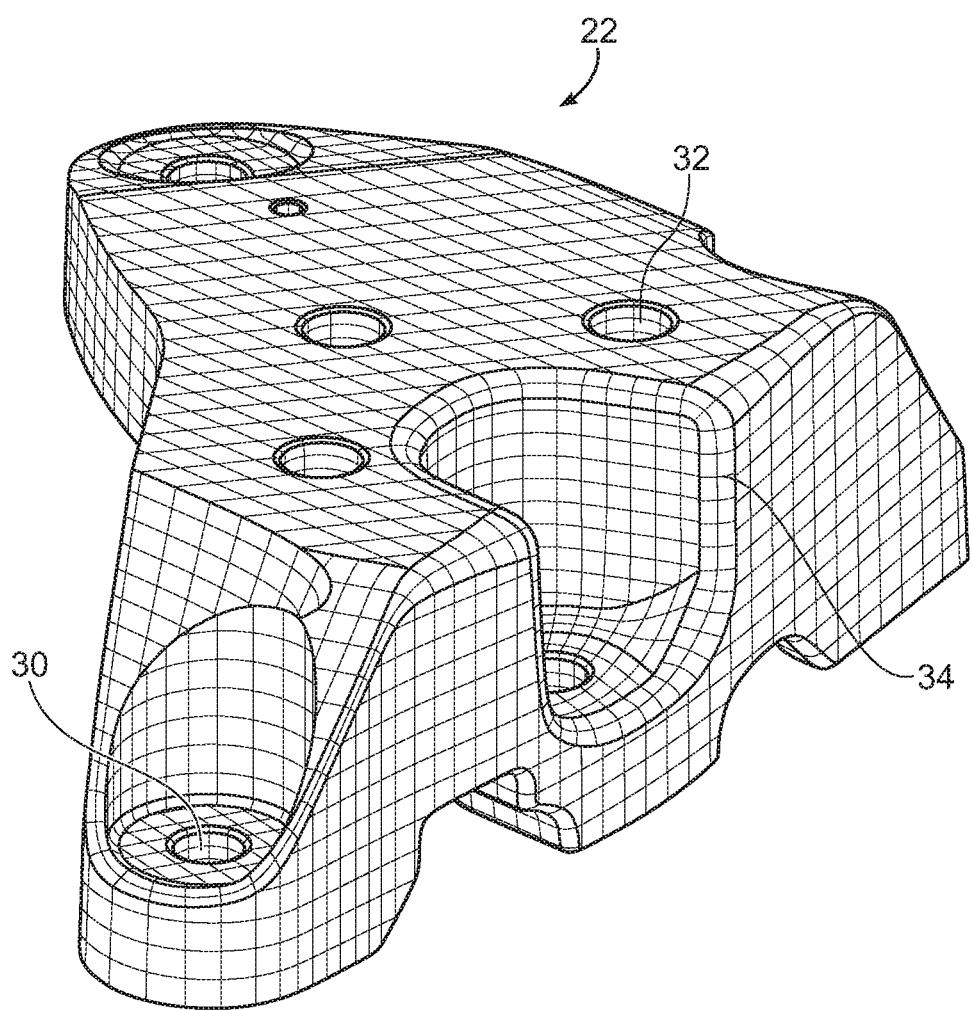
FIG. 4 is a perspective view of a meshed element model including elements of an automated process for parametric modeling in accordance with an example embodiment.

FIG. 4 illustrates an exemplary view of a meshed element model 22 which may be automatically parameterized using the methods and systems described herein. It should be appreciated that parameterization of the element model 20 may occur simultaneously with the meshing of the element model 20 in some embodiments. The meshed element model 22 of FIG. 4 illustrates various elements 30 which have been meshed, including holes 32 and a fillet 34.

Figure 5:
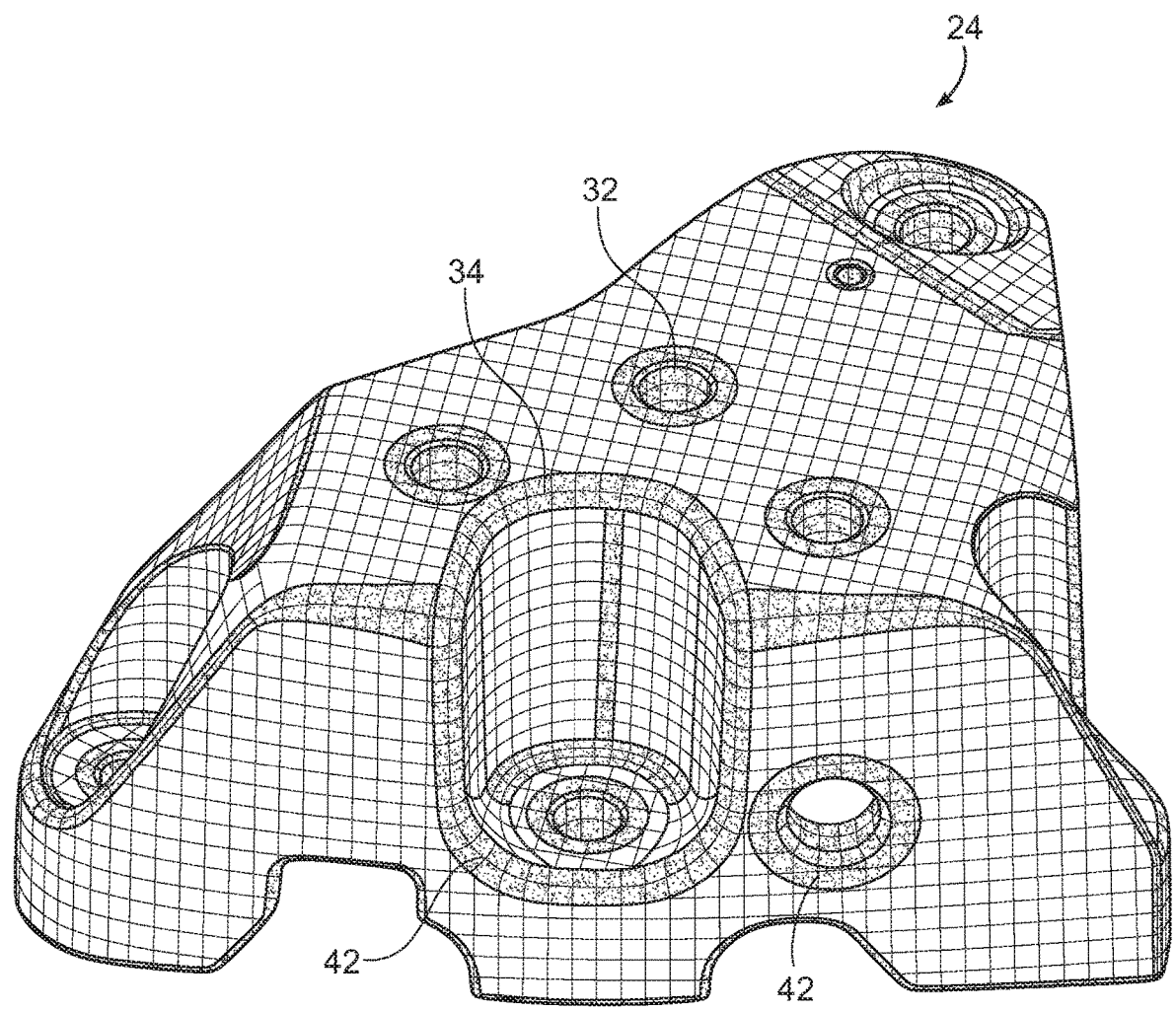
FIG. 5 is a perspective view of a parametric model including identified elements of an automated process for parametric modeling in accordance with an example embodiment.

FIG. 5 illustrates an exemplary view of a meshed element model 20 in which elements 30 such as geometric features have been identified by the computer system 100. This identification may be accomplished based on templates 54, rules 52, and/or features which were carried forward from the element model 20. The meshed element model 22 of FIG. 5 illustrates by shading that a number of holes 32 and a fillet 34 have been identified by the computer system 100.

Figure 6:
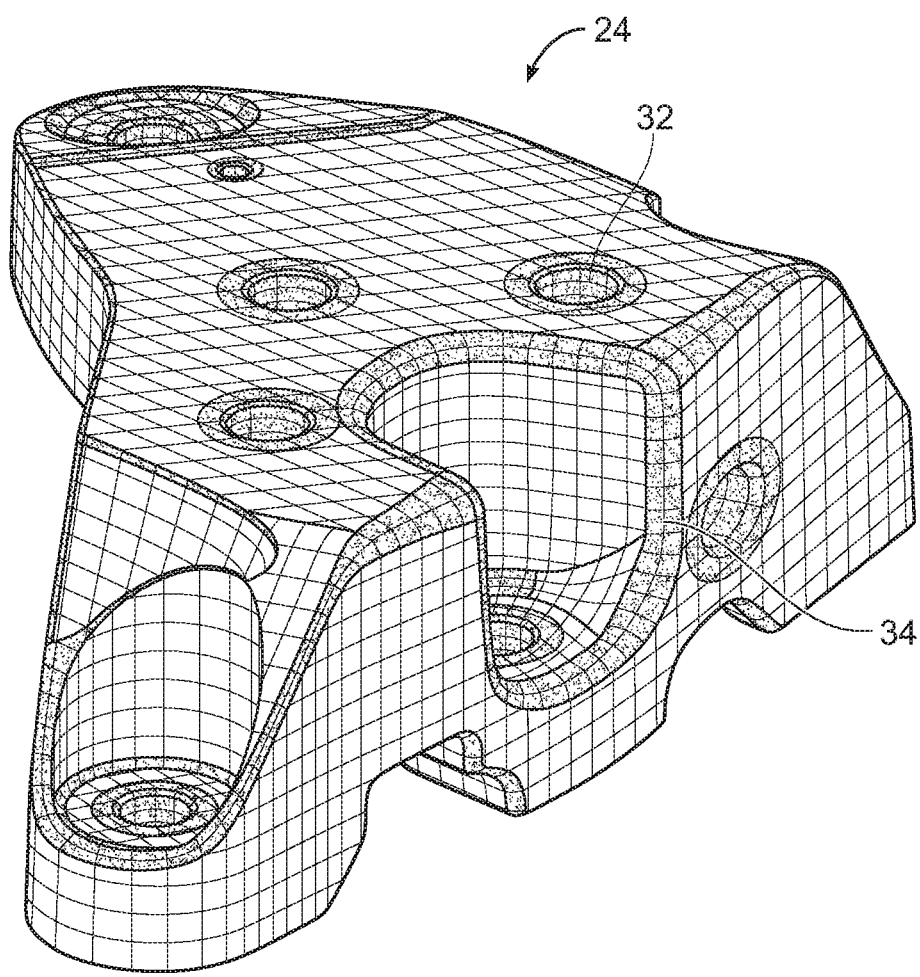
FIG. 6 is a perspective view of a parametric model including identified elements of an automated process for parametric modeling in accordance with an example embodiment.

FIG. 6 illustrates an exemplary view of a parametric model 24 which has been automatically created by the computer system 100 from the element model 20. The parametric model 24 may now be ready for adjustment of various parameters 56 of elements 30 thereof. In the exemplary embodiment shown in FIG. 6, elements 30 such as holes 32 and fillets 34 have been identified and parameterized according to the methods described herein.

Figure 7:
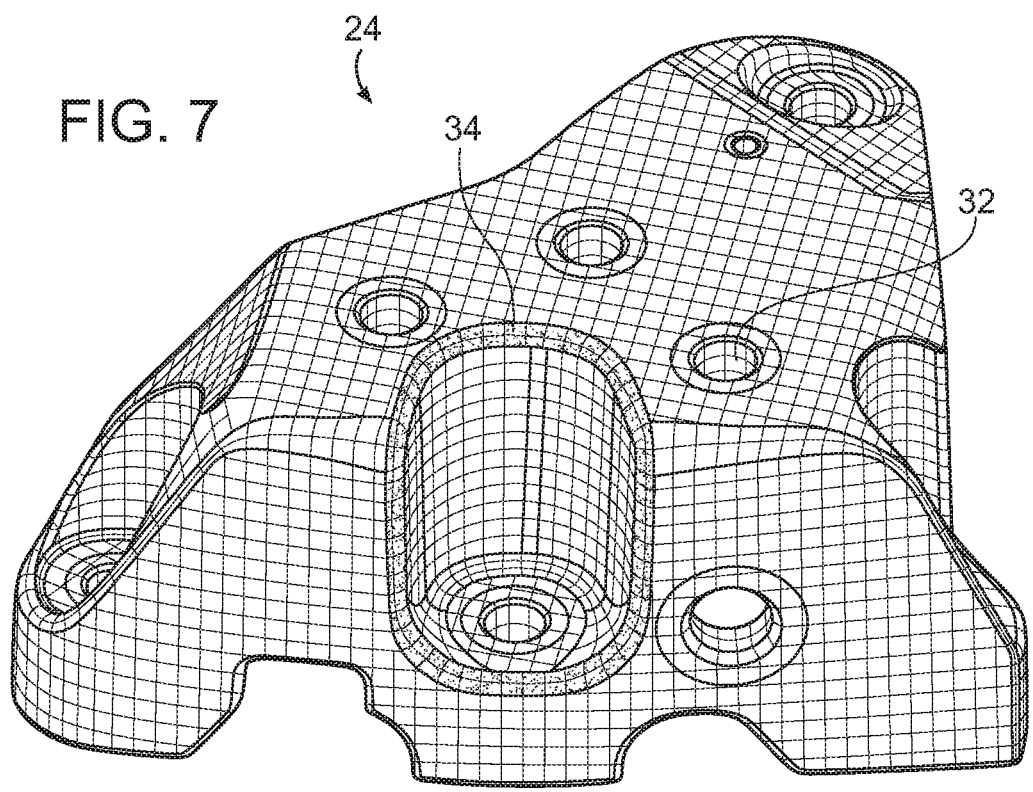
FIG. 7 is a perspective view of a parametric model illustrating minimum parameter modifications of an identified element of an automated process for parametric modeling in accordance with an example embodiment.
Figure 8:
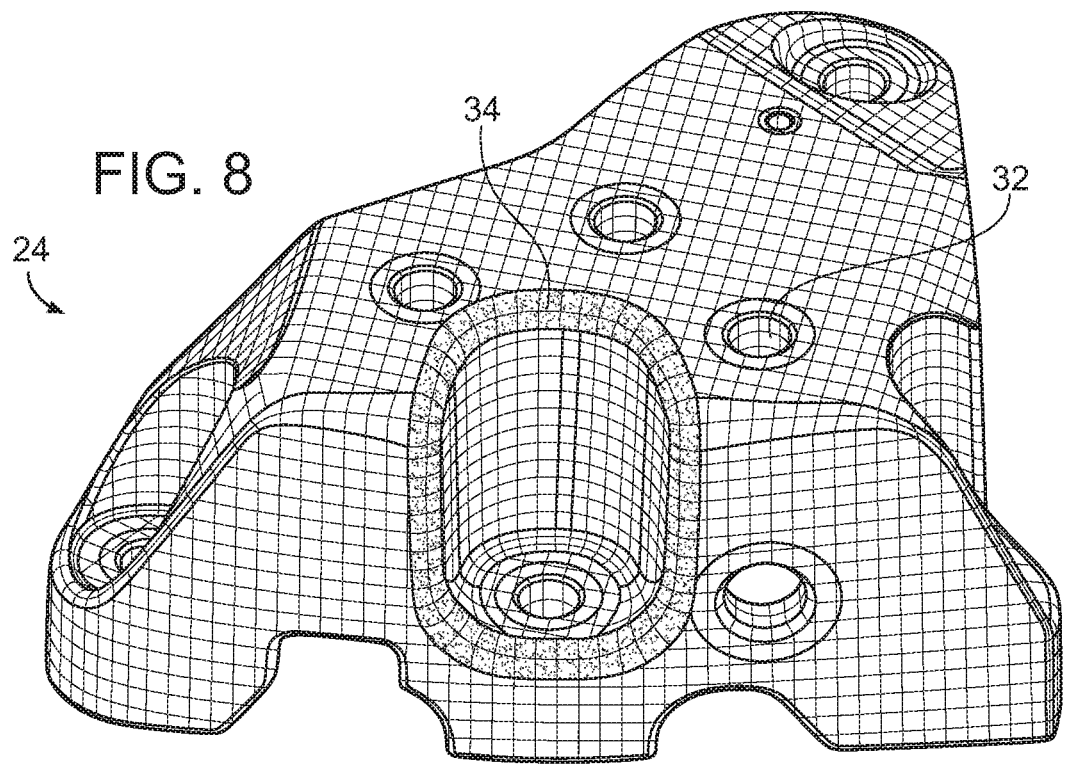
FIG. 8 is a perspective view of a parametric model illustrating maximum parameter modifications of an identified element of an automated process for parametric modeling in accordance with an example embodiment.

FIGS. 7 and 8 illustrate an exemplary view of a parametric model 24 which shows minimum and maximum parameter 56 modifications on an identified element 30, such as a fillet 34. FIG. 7 illustrates the minimum modification, in this case a minimum radius change, of a fillet 34. FIG. 8 illustrates the maximum modification, in this case a maximum radius change, of a fillet 34. The user of the computer system 100 may utilize inputs, such as via an interface 40 which may include a slider 44, to select a modification level between the minimum and maximum ranges. The minimum and maximum ranges may be determined in the parametric model 24 based on various rules 52 or the like, such as stress loads. The minimum and maximum ranges may be displayed as a range display 42, such as by illustrating with a cutout, lines, or shading, the possible range of modifications to be made to various elements 30.

Figure 9:
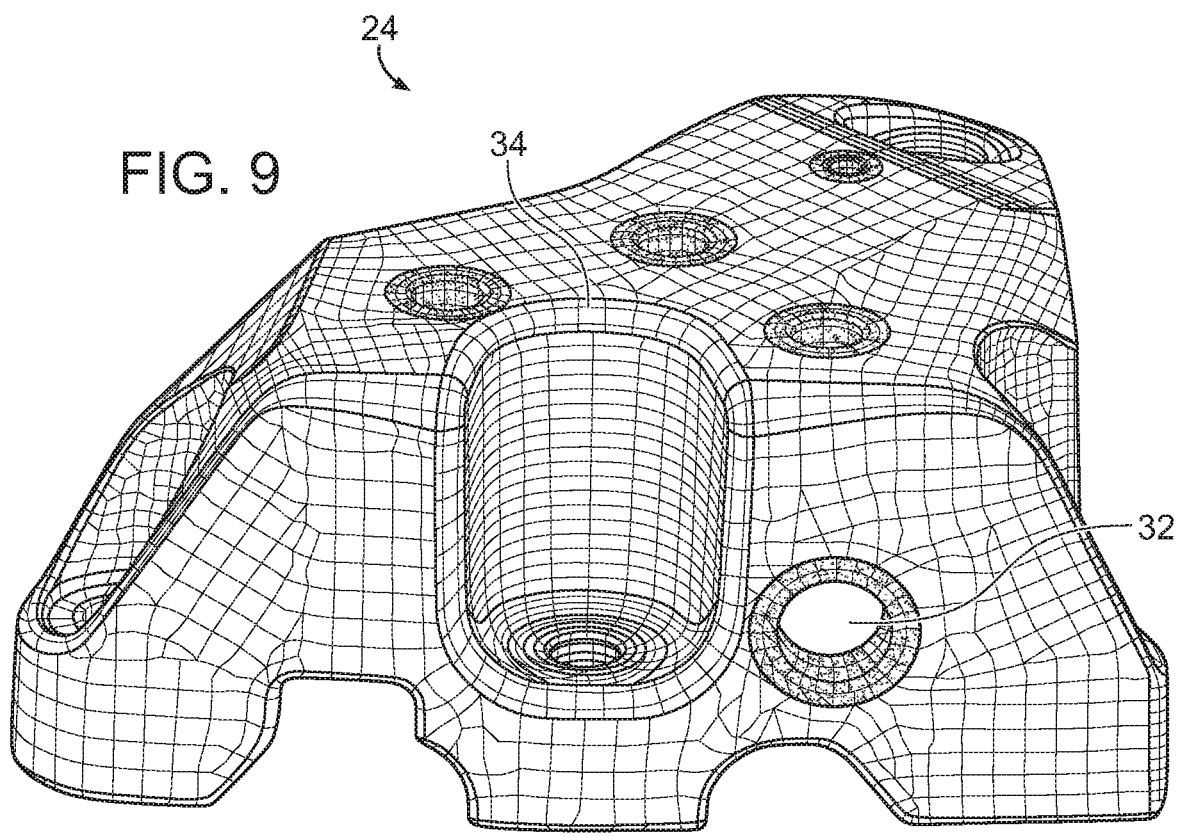
FIG. 9 is a perspective view of a parametric model illustrating maximum parameter modifications of an identified element of an automated process for parametric modeling in accordance with an example embodiment.
Figure 10:
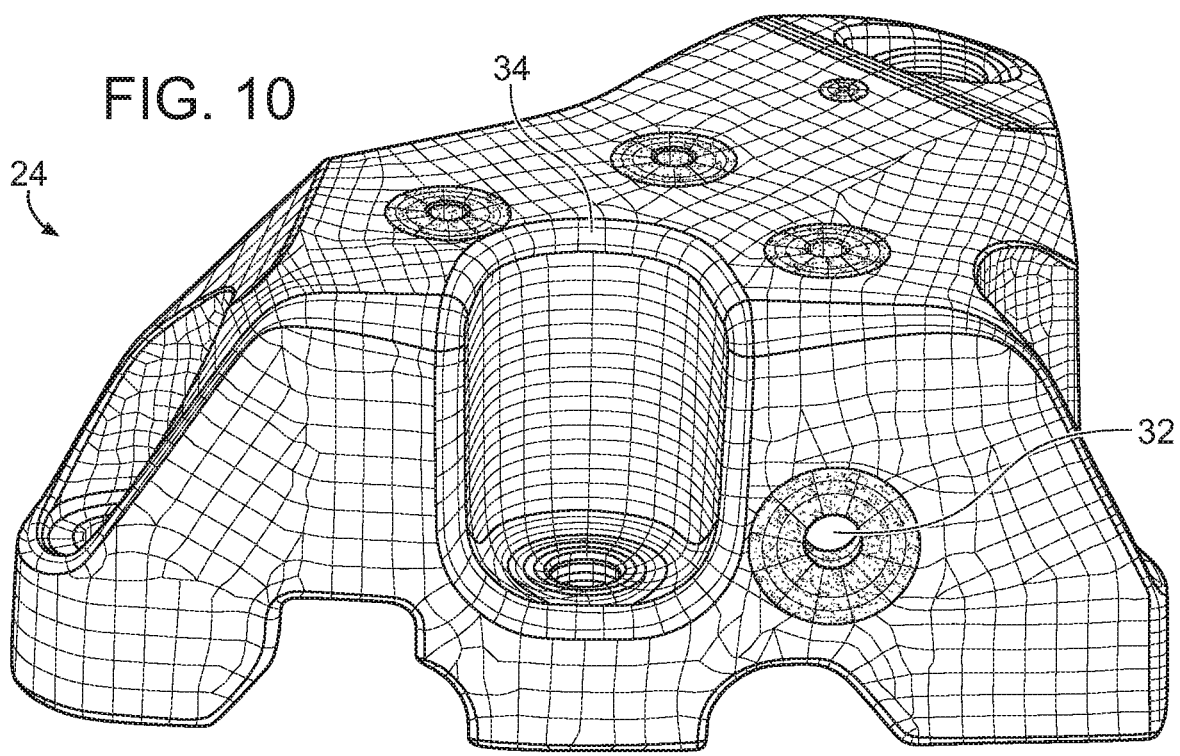
FIG. 10 is a perspective view of a parametric model illustrating minimum parameter modifications of an identified element of an automated process for parametric modeling in accordance with an example embodiment.

FIGS. 9 and 10 illustrate an exemplary view of a parametric model 24 which shows minimum and maximum parameter 56 modifications on an identified element 30, such as a hole 32. FIG. 9 illustrates a maximum modification, in this case a maximum diameter change, of a hole 32. FIG. 10 illustrates the minimum modification, in this case a maximum diameter change, of a hole 32. The user of the computer system 100 may utilize inputs, such as via an interface 40 which may include a slider 44, to select a modification level between the minimum and maximum ranges, which may be determined in the parametric model 24 as discussed herein.

Figure 11:
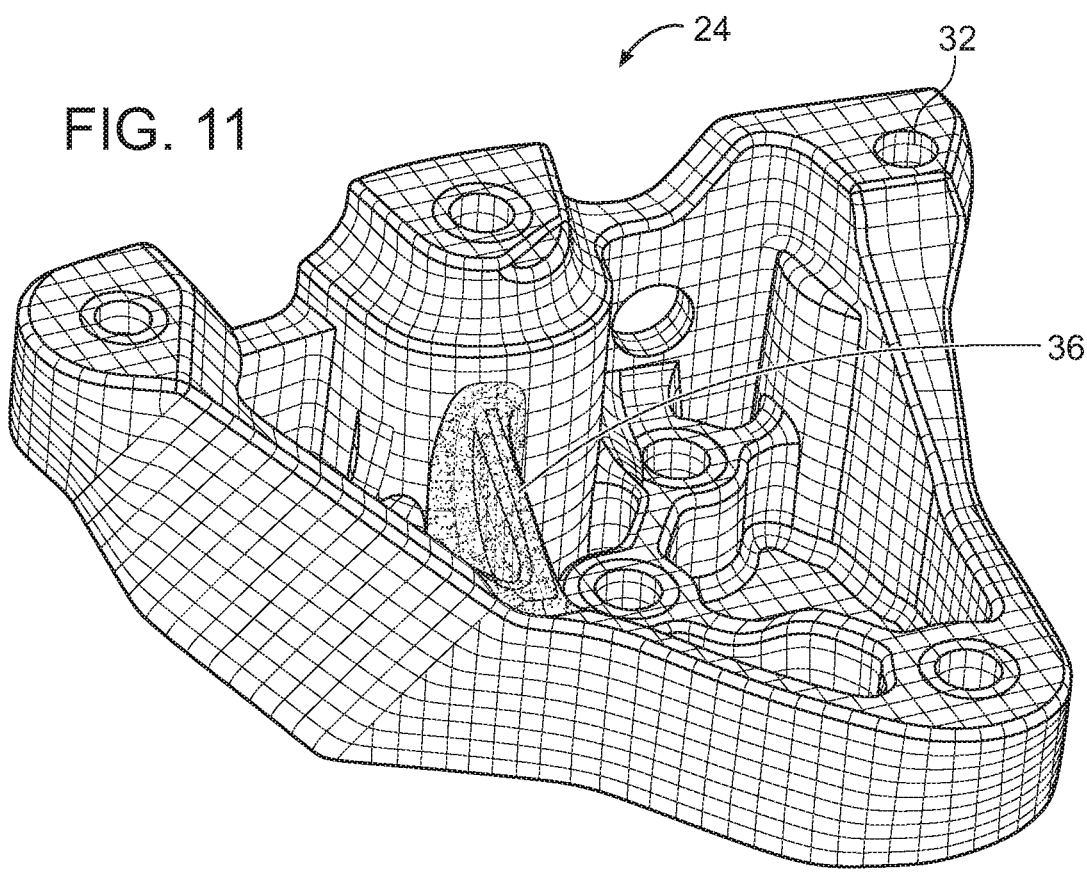
FIG. 11 is a perspective view of a parametric model illustrating minimum parameter modifications of an identified element of an automated process for parametric modeling in accordance with an example embodiment.
Figure 12:
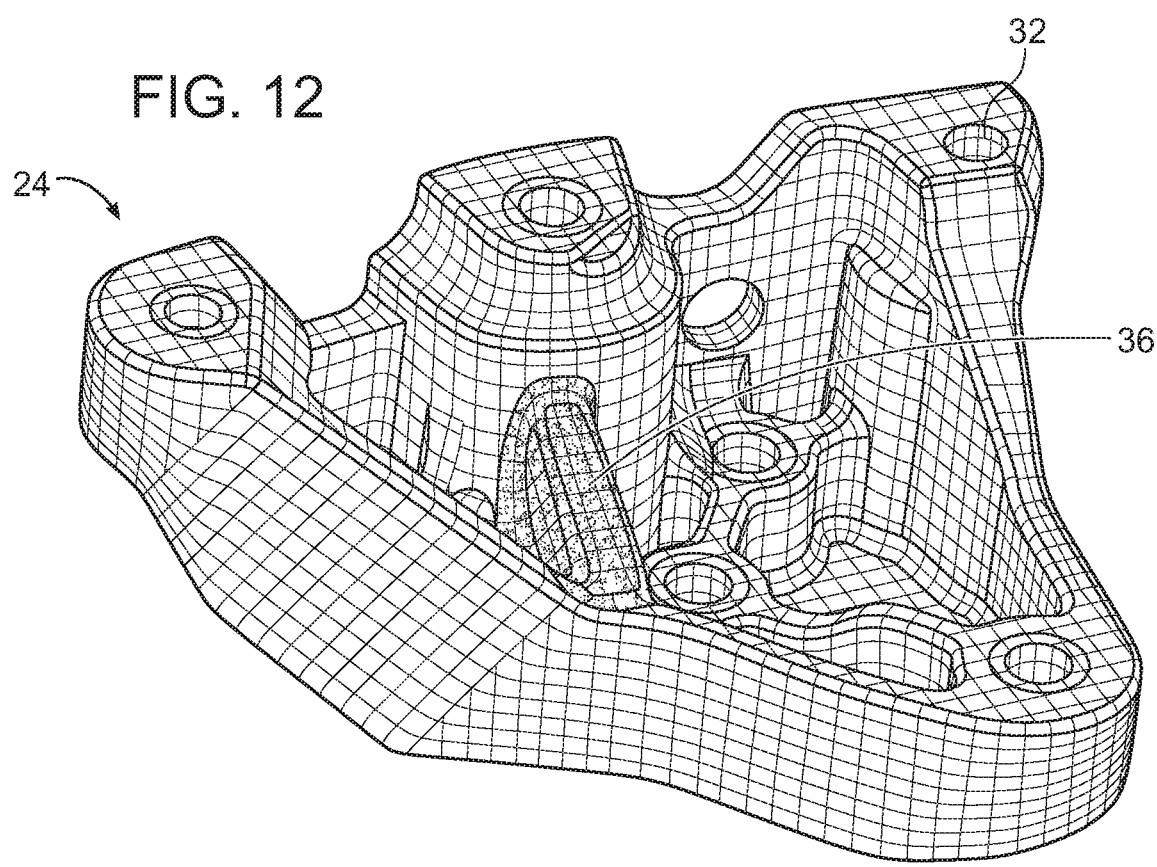
FIG. 12 is a perspective view of a parametric model illustrating maximum parameter modifications of an identified element of an automated process for parametric modeling in accordance with an example embodiment.

FIGS. 11 and 12 illustrate an exemplary view of a parametric model 24 which shows minimum and maximum parameter 56 modifications on an identified element 30, such as a rib 36. FIG. 11 illustrates a minimum modification, in this case a minimum thickness change, of a rib 36. FIG. 12 illustrates a maximum modification, in this case a maximum thickness change, of a rib 36. The user of the computer system 100 may utilize inputs, such as via an interface 40 which may include a slider 44, to select a modification level between the minimum and maximum ranges, which may be determined in the parametric model 24 as discussed herein.

Figure 13:
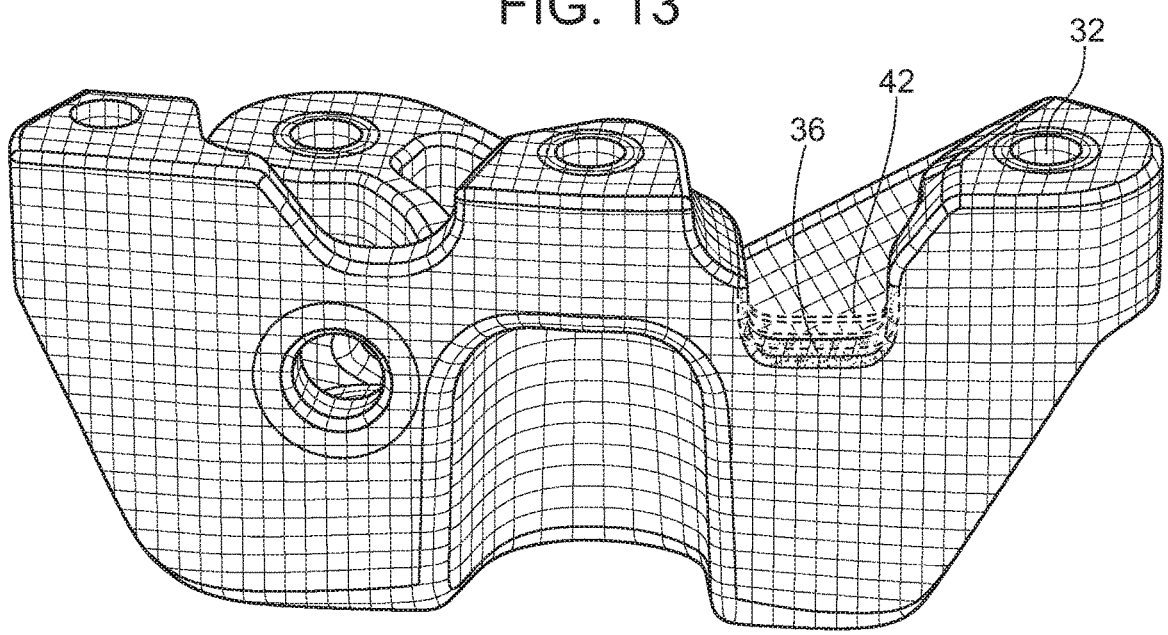
FIG. 13 is a perspective view of a parametric model illustrating minimum parameter modifications of an identified element of an automated process for parametric modeling in accordance with an example embodiment.
Figure 14:
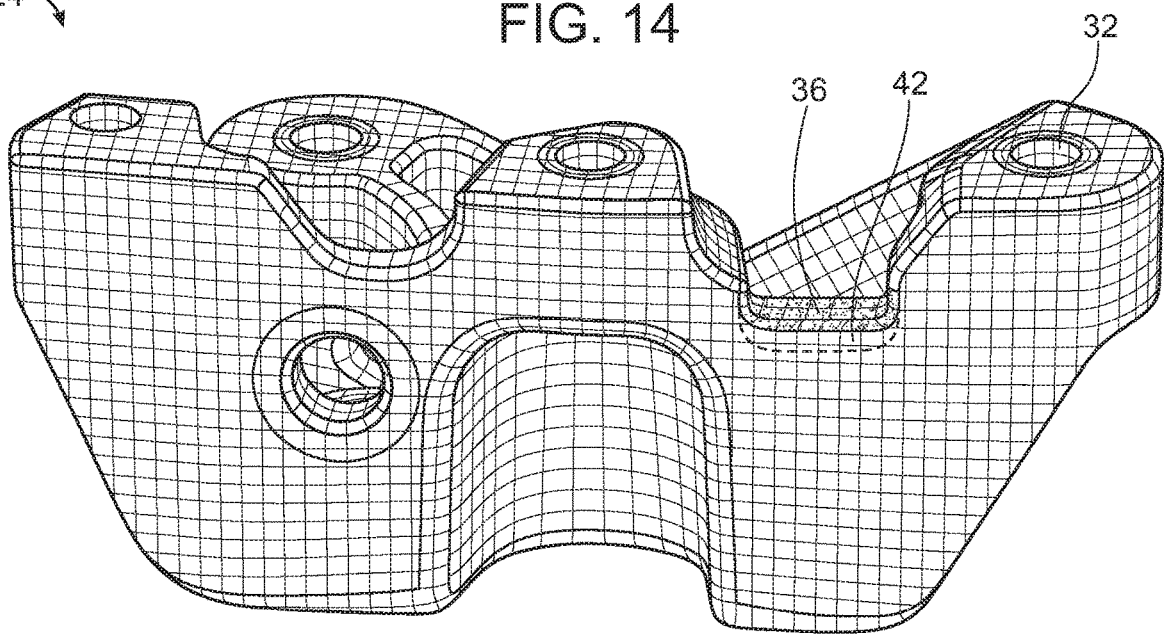
FIG. 14 is a perspective view of a parametric model illustrating maximum parameter modifications of an identified element of an automated process for parametric modeling in accordance with an example embodiment.

FIGS. 13 and 14 illustrate an exemplary view of a parametric model 24 which shows minimum and maximum parameter 56 modifications on an identified element 30, such as a rib 36. FIG. 11 illustrates a minimum modification, in this case a minimum height change, of a rib 36. FIG. 12 illustrates a maximum modification, in this case a maximum height change, of a rib 36. The user of the computer system 100 may utilize inputs, such as via an interface 40 which may include a slider 44, to select a modification level between the minimum and maximum ranges, which may be determined in the parametric model 24 as discussed herein.

Figure 15A:
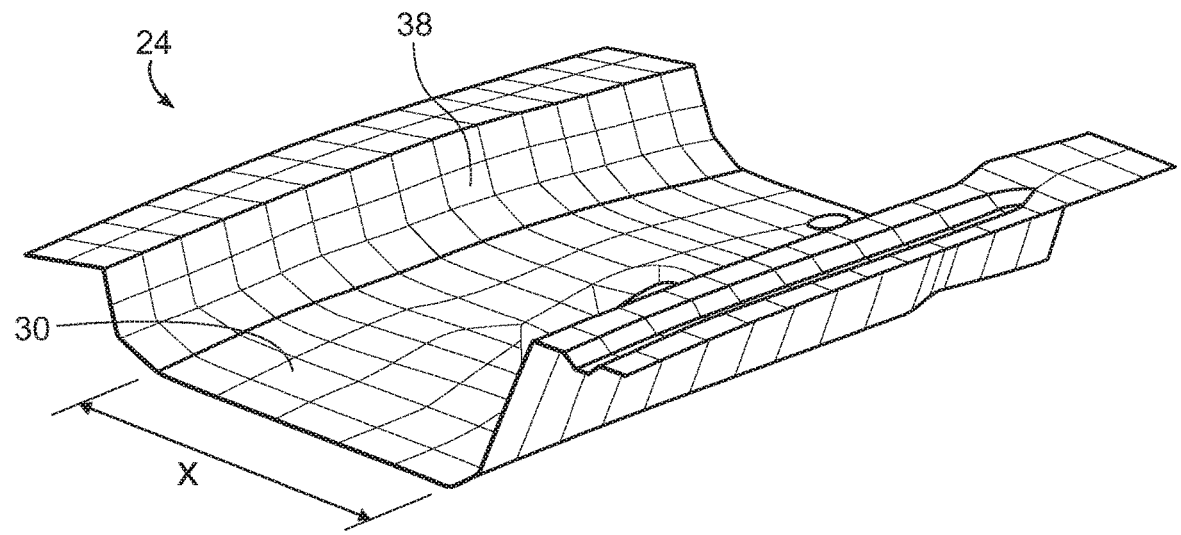
FIG. 15A is a perspective view of a parametric model prior to parameter modification of an identified element of an automated process for parametric modeling in accordance with an example embodiment.
Figure 15B:
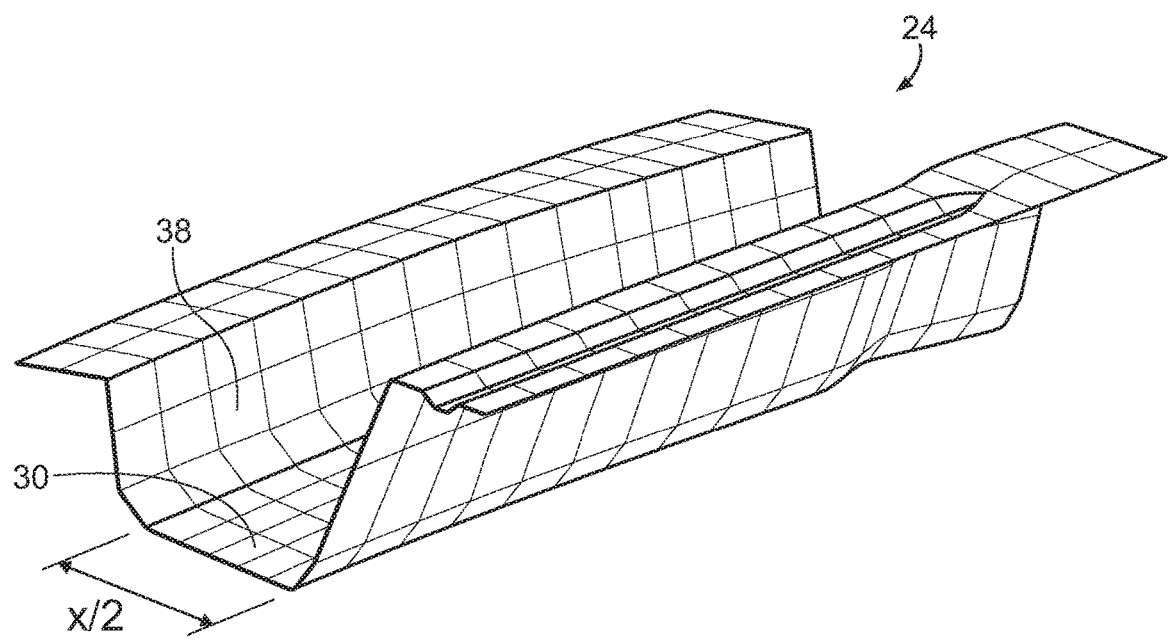
FIG. 15B is a perspective view of a parametric model after parameter modification of an identified element of an automated process for parametric modeling in accordance with an example embodiment.

FIGS. 15a and 15b illustrate an exemplary view of a parametric model 24 in which depth and width parameters 56 may be changed, such as on elements 30 including a flange. In FIG. 15a, the unmodified parametric model 24 is shown. In FIG. 15b, it can be seen that the depth and width parameters 56 have been reduced. Using the methods and systems described herein, the parametric model 24 may be automatically created to allow modifications such as shown in FIG. 15b to be easily entered by a user; thus increasing the overall efficiency of the computer system 100 being used for the design.

FIGS. 16a, 16b, and 16c illustrate the creation of a parametric model 24 to change the radius of an element 30 of the parametric model 24, such as a fillet 34. As can be seen, a mesh has already been applied. In the case of an element model 20 that did not originally have a mesh, the mesh may be applied by the computer system 100. FIG. 16a illustrates an exemplary interface 40 which may be utilized to change the element 30 radius as shown in FIGS. 16b-16c. It should be appreciated that the interface 40 shown is merely for exemplary purposes, and the arrangement of various features of the interface 40 may vary between different embodiments.

As shown in FIGS. 16a, 16b, and 16c, to change the radius of an element 30 of the model 24, the computer system 100 may receive a selection of "fillet radius change"

from a number of parameter 56 options (other parameter 56 options illustrated in this exemplary view of an interface 40 include "tube diameter change", "rib height change", and "rib thickness change"). The computer system 100 may then receive a selection of any surfaces of the element 30 which need to be changed.

The computer system 100 may receive a selection of the percentage zone required to undergo the change along the element 30 and a selection of the percentage range of radius change. A preview of the created parameter 56 may be viewed by clicking on "Review", and the parameters 56 may be created by clicking "Execute". FIGS. 9 and 10 illustrate a radius change of an element 30 using the method described above.

Figure 17A:
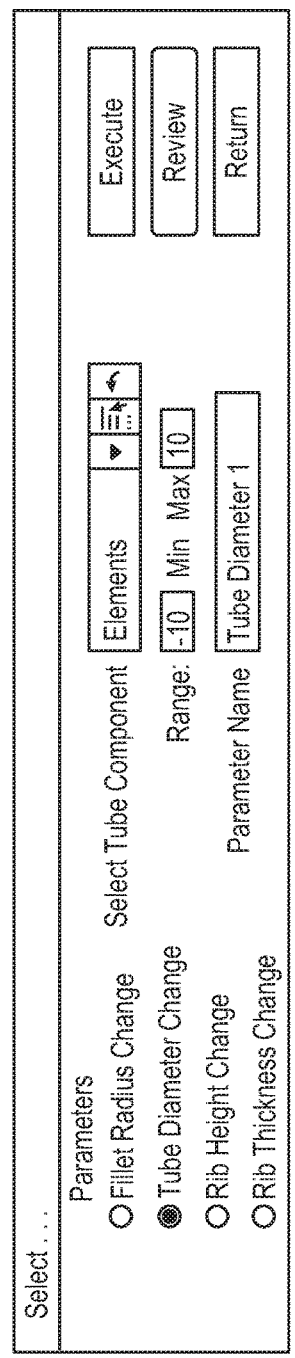
FIG. 17A is a perspective view of an exemplary interface for use with an automated process for parametric modeling in accordance with an example embodiment.
Figure 17B:
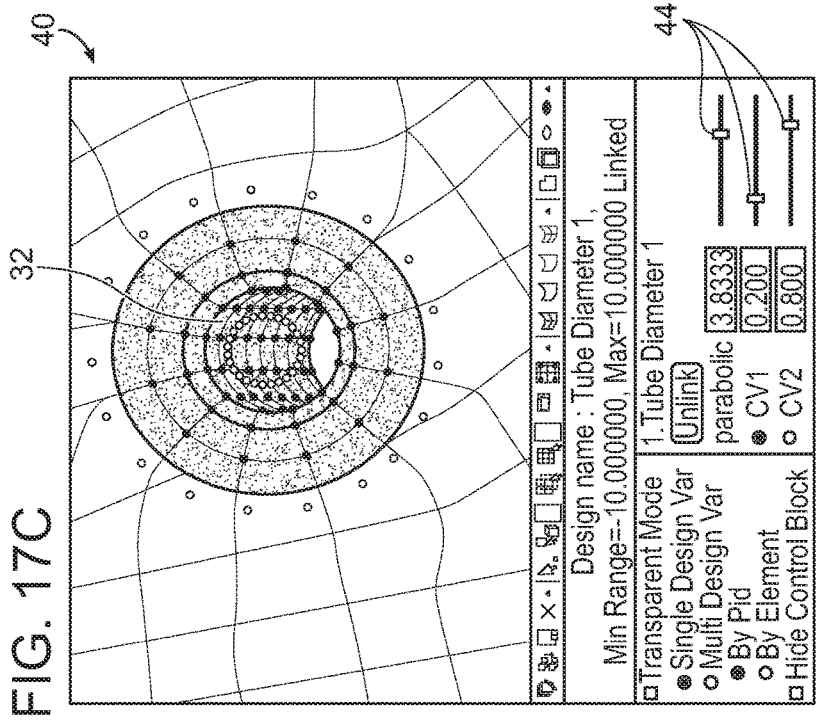
FIG. 17B is a perspective view of a parametric model prior to modification by an automated process for parametric modeling in accordance with an example embodiment.
Figure 17C:
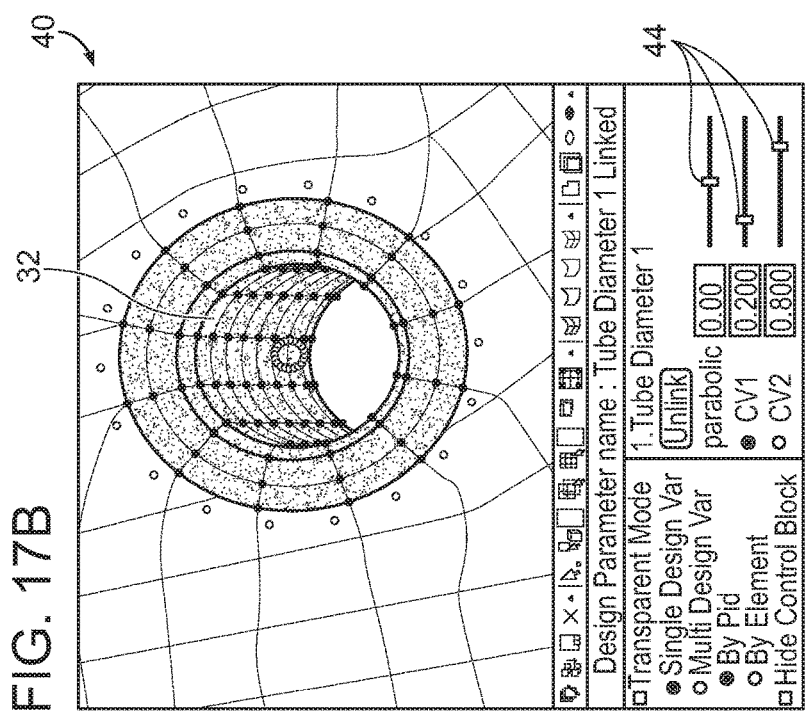
FIG. 17C is a perspective view of a parametric model after modification by automated process for parametric modeling in accordance with an example embodiment.

FIGS. 17a, 17b, and 17c illustrate the creation of a parametric model 24 to change the diameter of an element 30 in a parametric model 24, such as a tube or hole. FIG. 17a illustrates an exemplary interface 40 which may be utilized to change the element 30 diameter as shown in FIGS. 17b and 17c. The computer system 100 may receive a selection of any surfaces of the element 30 which need to be changed. The computer system 100 may then receive, through entry in the interface 40 by a user, a minimum and maximum range for the diameter change. The parameter 56 may be named by entry into the interface for future reference. By clicking "execute", the parametric model 24 may be created.

By clicking "review", the created parameter 56 may be reviewed. FIGS. 17b and 17c illustrate an exemplary interface 40 for reviewing the created parameter 56. As can be seen, sliders 44 may be provided which may be modified to review the diameter change. The sliders 44 may be adjusted in a first direction to reduce the diameter or in a second direction to enlarge the diameter such as shown in FIGS. 17b and 17c. FIGS. 7 and 8 illustrate diameter changes applied to elements 30 of a parametric model 24.

Figures 18, 19:
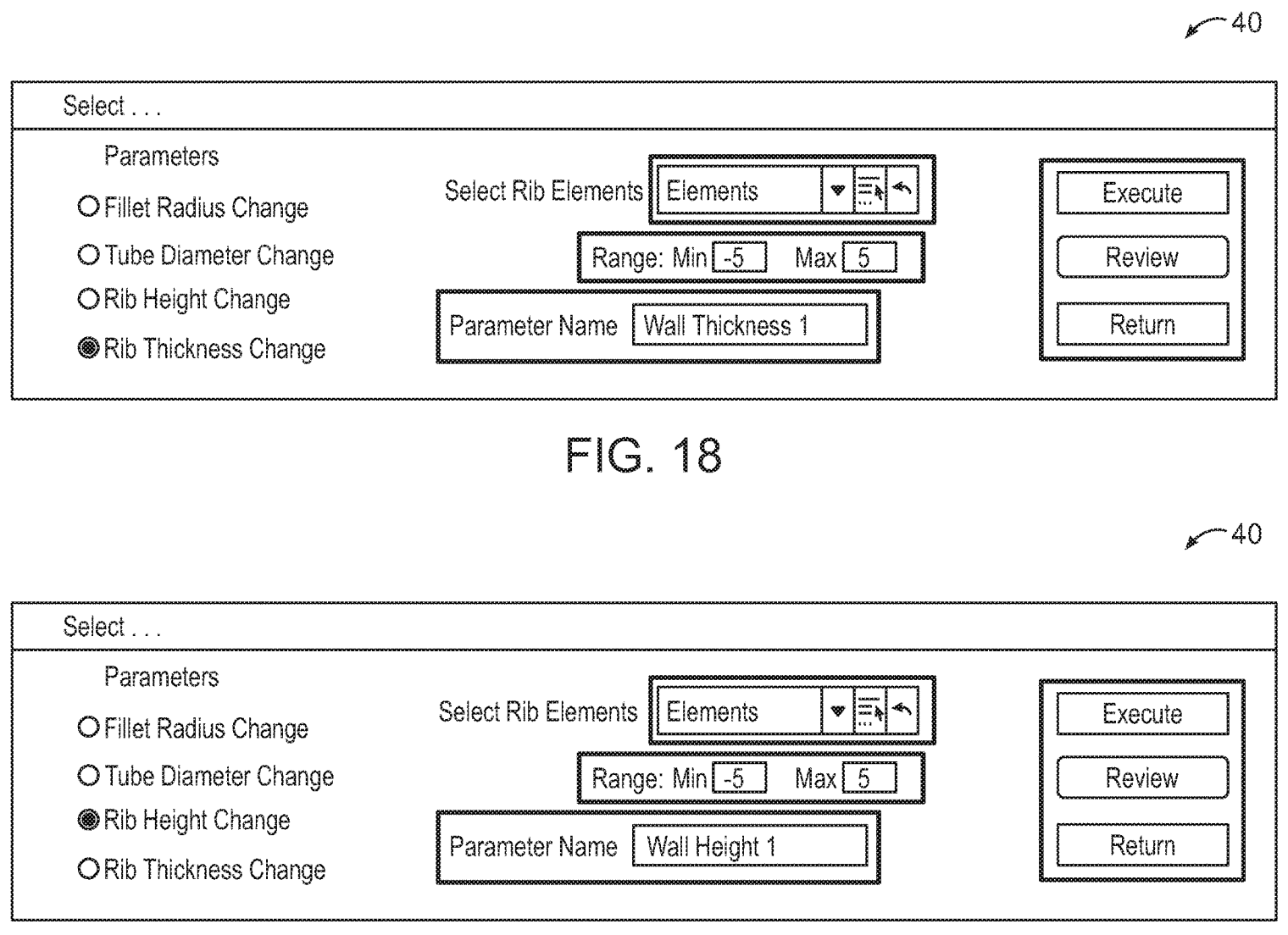

FIG. 18 illustrates an exemplary interface for creation of a parametric model 24 to change the thickness of an element 30 such as a rib. The computer system 100 may receive a selection of any surfaces of the element 30 to be changed. Through entry in the interface 40 by a user, the computer system 100 may receive a minimum and maximum range for the thickness change. The parameter 56 may be named by entry into the interface for future reference. By clicking "execute", the parametric model 24 may be created. By clicking "review", the created parameter 56 may be reviewed. FIGS. 11-12 illustrate thickness changes applied to elements 30 of a parametric model 24.

Figures 20, 21:
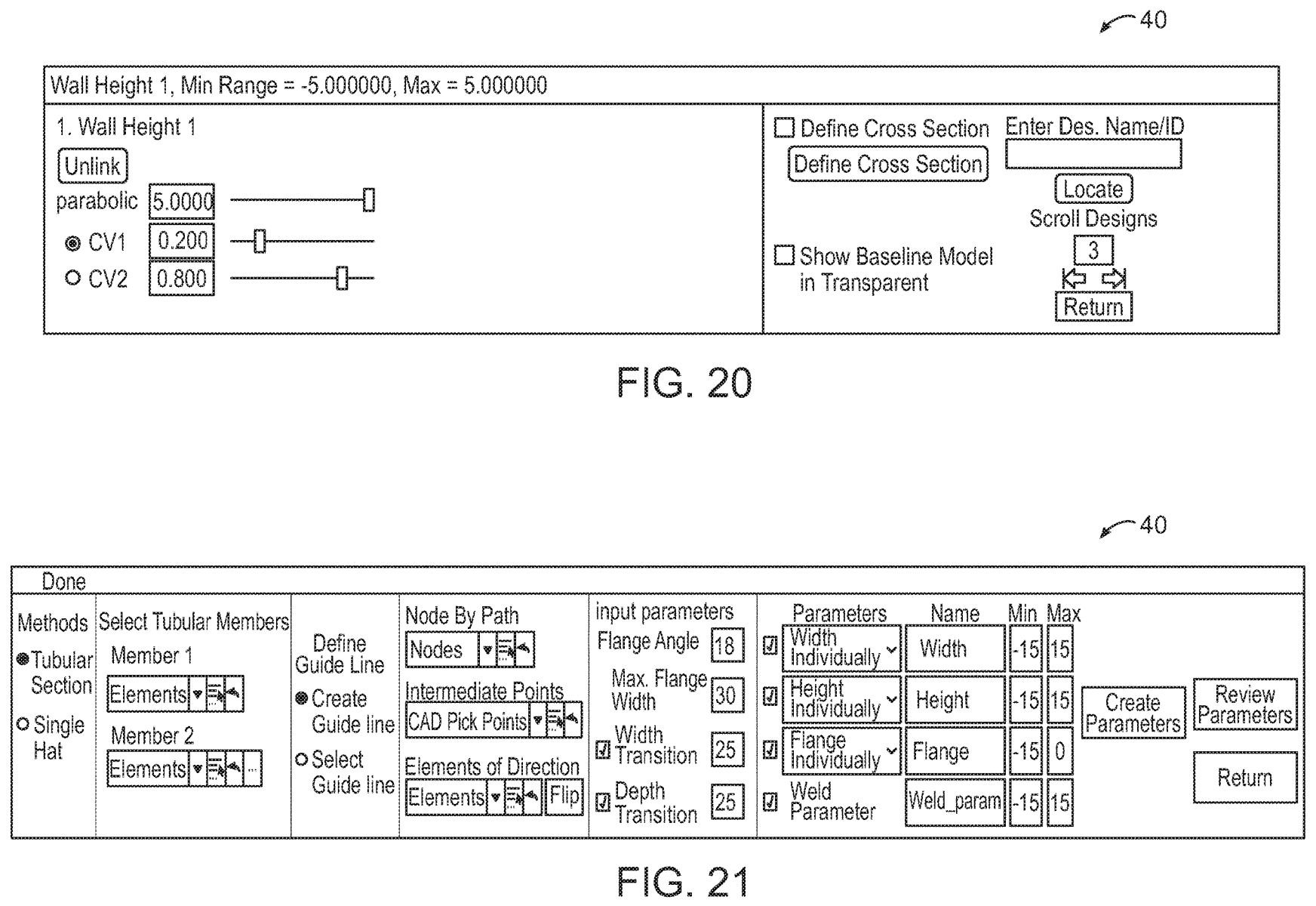

FIG. 19 illustrates an exemplary interface 40 for creation of a parametric model 24 to change the height of an element 30 such as a rib. The computer system 100 may receive a selection of any surfaces of the element 30 to be changed. Through entry in the interface 40 by a user, the computer system 100 may receive a minimum and maximum range for the height change. The parameter 56 may be named by entry into the interface for future reference. By clicking "execute", the parametric model 24 may be created. By clicking "review", the created parameter 56 may be reviewed. FIG. 20 illustrates an exemplary review interface 40 including sliders 44 for reviewing proposed changes. FIGS. 13 and 14 illustrate height changes applied to elements 30 of a parametric model 24.

Figure 22:
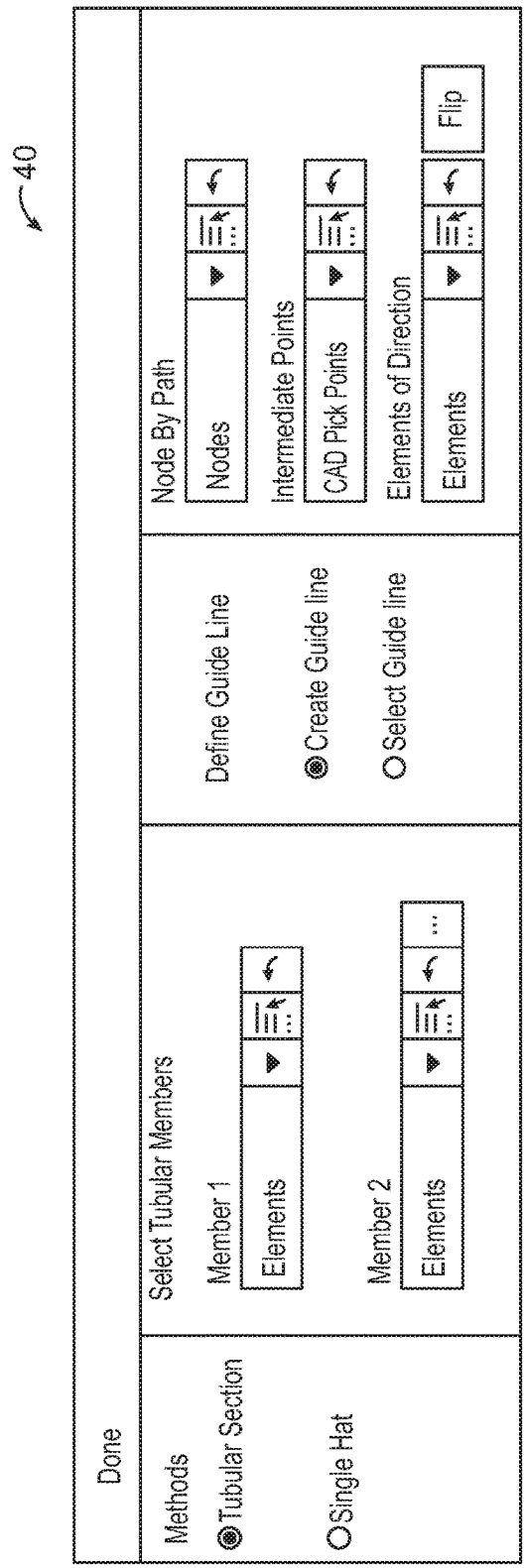
FIG. 22 is a view of an exemplary interface for use with an automated process for parametric modeling in accordance with an example embodiment.
Figure 23:
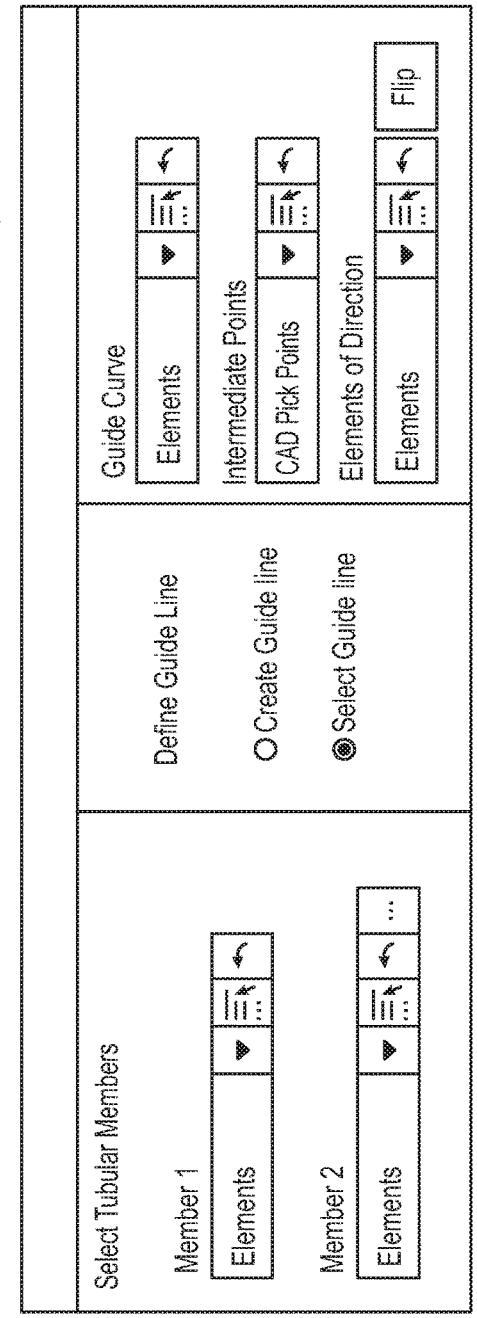
FIG. 23 is a view of an exemplary interface for use with an automated process for parametric modeling in accordance with an example embodiment.

FIG. 21 illustrates an exemplary interface 40 for parameterization of a tubular section. The computer system 100 may receive a selection of the outer top and bottom members of the element 30 to be parameterized. By selecting "Node by Path" or by selecting an existing 1D element, a user may instruct the computer system 100 to define the parametric region. The user may select CAD points on a CAD curve to define intermediate section points. The user may then create a line of elements 30 to define the parameter 56 directions with the interface 40 shown in FIG. 22, or select a guide line using the interface 40 shown in FIG. 23. The computer system 100 may then receive the required input parameter 56 value and name. By clicking "Create Parameters", the model may automatically be parameterized by the computer system 100.

The interface of FIG. 21 may also be utilized for single hat section parameterization by selecting the "single hat" option under "Methods". The element 30 to be parameterized, its surroundings, and any nearby elements 30 may be selected by a user of the computer system 100. The parametric region may be defined by selecting nodes by path or by selecting an existing 1D element 30 to define the parametric region. The CAD points on a CAD curve may be selected to define intermediate section points. A line of elements 30 may be selected to define the parameter 56 directions. Finally, the required input parameter 56 value, parameter 56 name, and morph control may be selected to parameterize the model 20, 22 after selecting "Create Parameters". Created parameters 56 may then be reviewed.

FIGS. 24 and 25 illustrate exemplary interfaces 40 to enter inputs to parameterize the model 20, 22. Parameter 56 inputs may include the choice of parameter 56 creation, type of parameters 56 (which may be selected from a drop-down menu), and minimum and maximum values for the respective parameter 56. Parameters 56 may be created and reviewed using the same interface 40.

Figure 26:
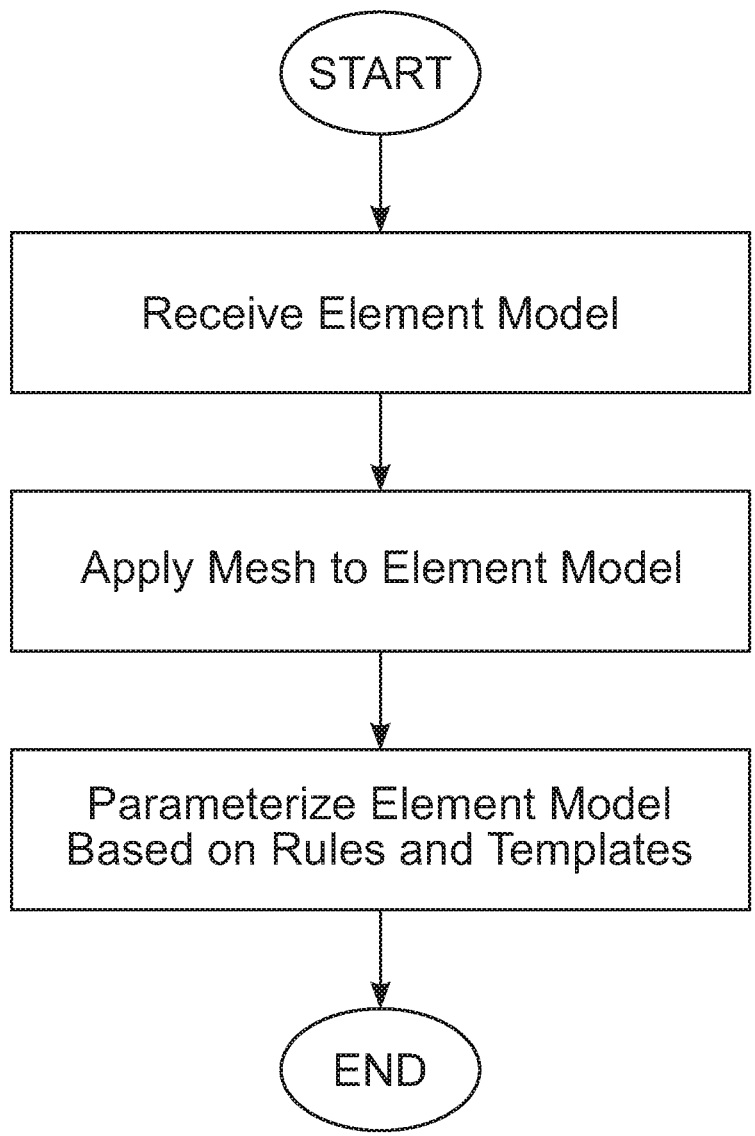
FIG. 26 is a flowchart illustrating an exemplary method for automatically creating a parametric model from an element model of an automated process for parametric modeling in accordance with an example embodiment.

FIG. 26 illustrates an exemplary method for automatically creating a parametric model from an element model 20. As shown, the computer system 100 may first receive the element model 20 and then apply a mesh to the element model 20 to create the meshed element model 22. The element model 20 may then be parameterized based on rules 52 and templates 54 as described herein.

Figure 27:
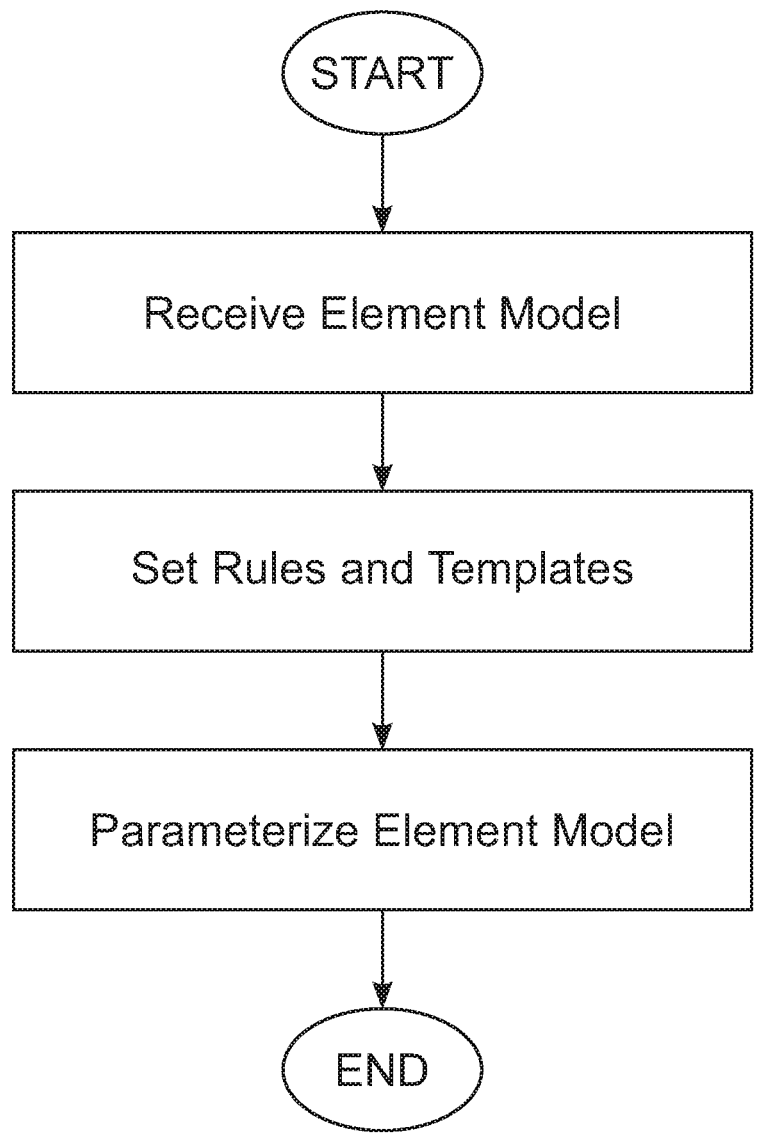
FIG. 27 is a flowchart illustrating an exemplary method for automatically creating a parametric model from an element model of an automated process for parametric modeling in accordance with an example embodiment.

FIG. 27 illustrates an exemplary method for automatically creating a parametric model 24 from an element model 20. As shown, the computer system 100 may first receive the element model 20. Any rules 52 and templates 54 may then be set, such as by a user. The computer system 100 will then parameterize the element model 20 based on the rules 52 and templates 54.

Figure 28:
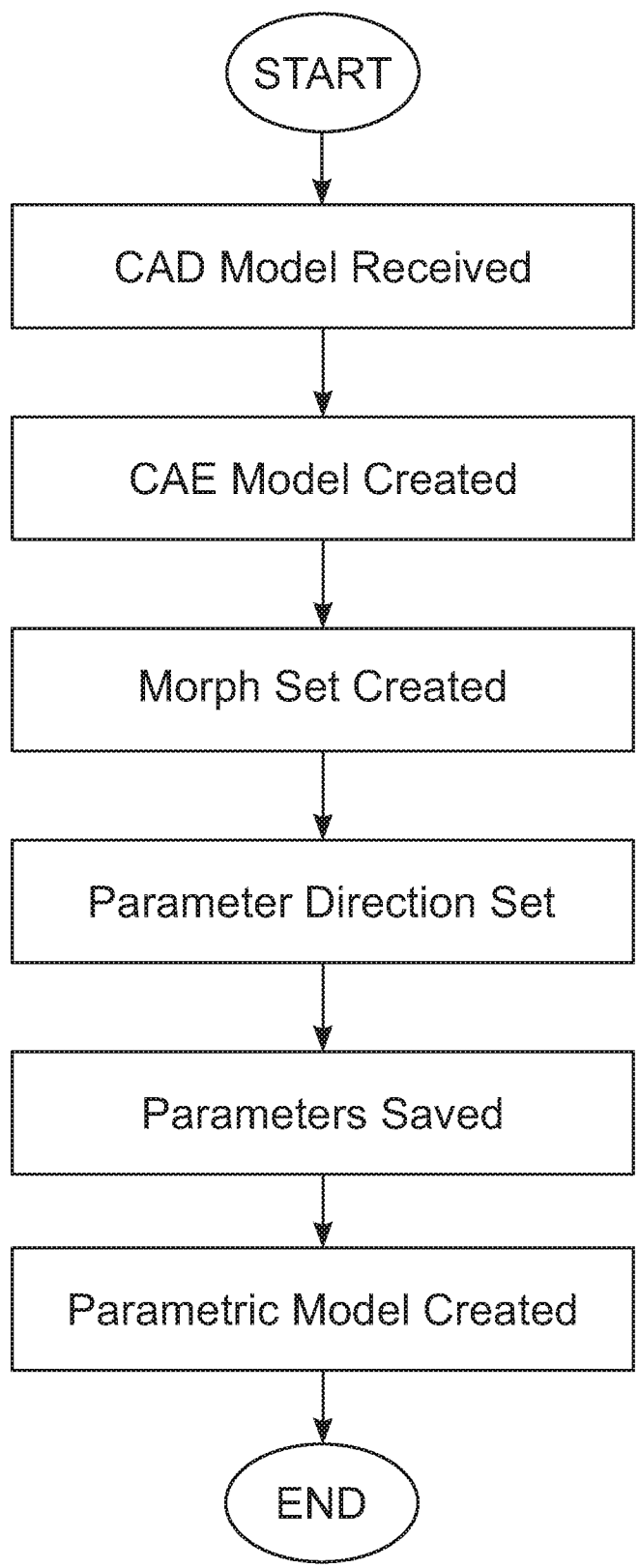
FIG. 28 is a flowchart illustrating an exemplary method for creating a parametric model from a CAD model of an automated process for parametric modeling in accordance with an example embodiment.

FIG. 28 illustrates an exemplary method for creating a parametric model 24 from an element model 20 comprising a CAD model. As shown, the CAD model is first converted into a CAE model. A morph set may then be created. The parameter 56 direction may be set by the user and the parameters 56 saved. The computer system 100 will then automatically create the parametric model 24.

Figure 29:
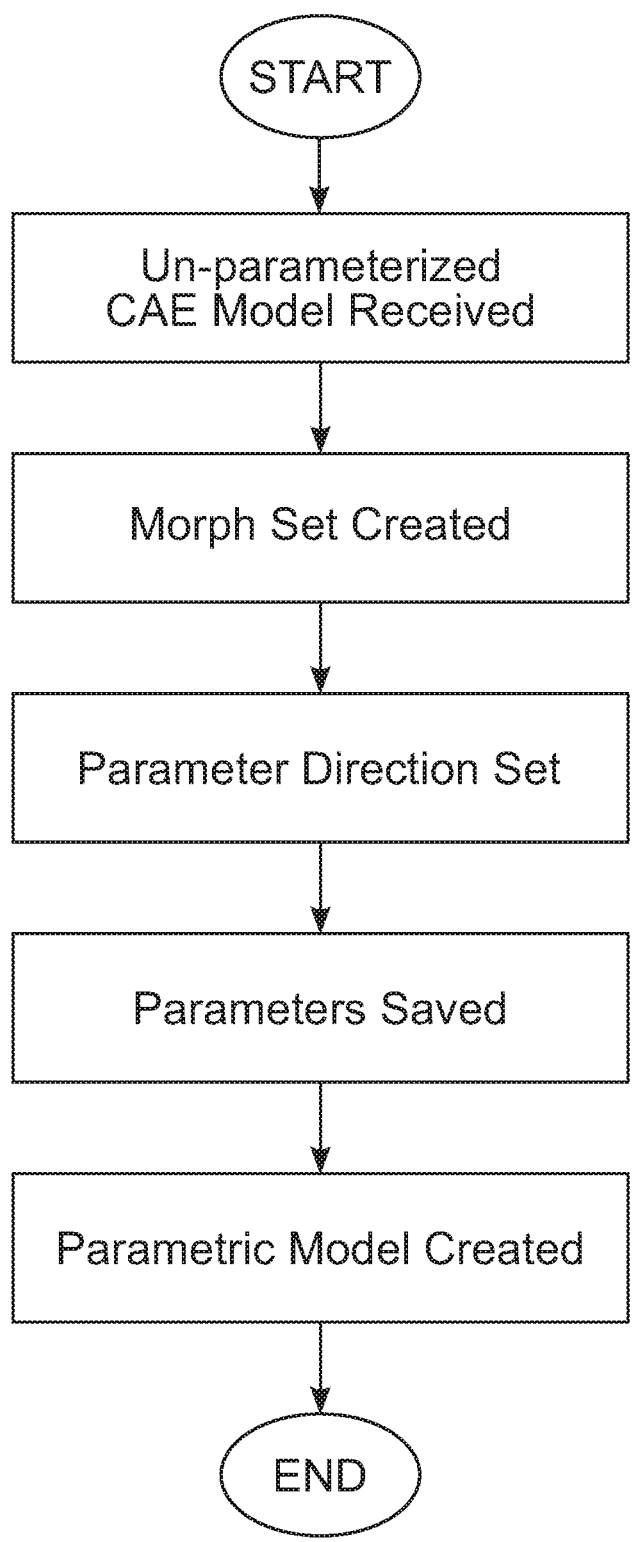
FIG. 29 is a flowchart illustrating an exemplary method for creating a parametric model from an un-parameterized CAE model of an automated process for parametric modeling in accordance with an example embodiment.

FIG. 29 illustrates an exemplary method for creating a parametric model 24 from an un-parameterized element model 20 comprising a CAE model. A morph set is created and parameter 56 direction is set. The parameters 56 may be saved and the computer system 100 will automatically create the parametric model 24.

Figure 30:
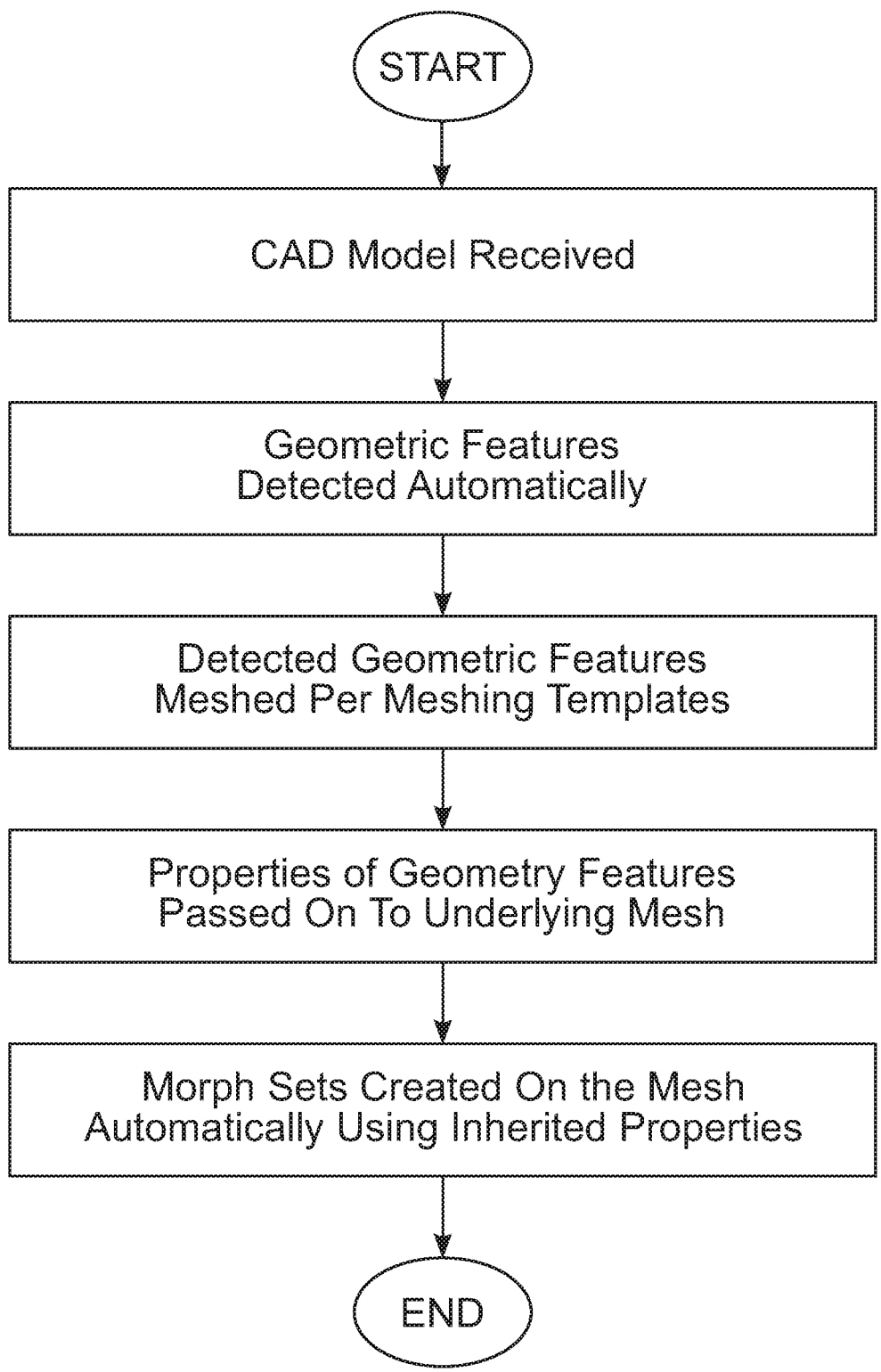
FIG. 30 is a flowchart illustrating an exemplary method for parameterizing a CAD model of an automated process for parametric modeling in accordance with an example embodiment.

FIG. 30 illustrates an exemplary method for parameterizing an element model 20 comprised of a CAD model. Elements 30 such as geometric features are detected automatically by the computer system 100. The detected geometric features may be meshed per meshing templates 54 by the computer system 100. Properties of the geometric features may be passed on to the underlying mesh. Morph sets may be created on the mesh automatically using the inherited properties from the element model 20.

Figure 31:
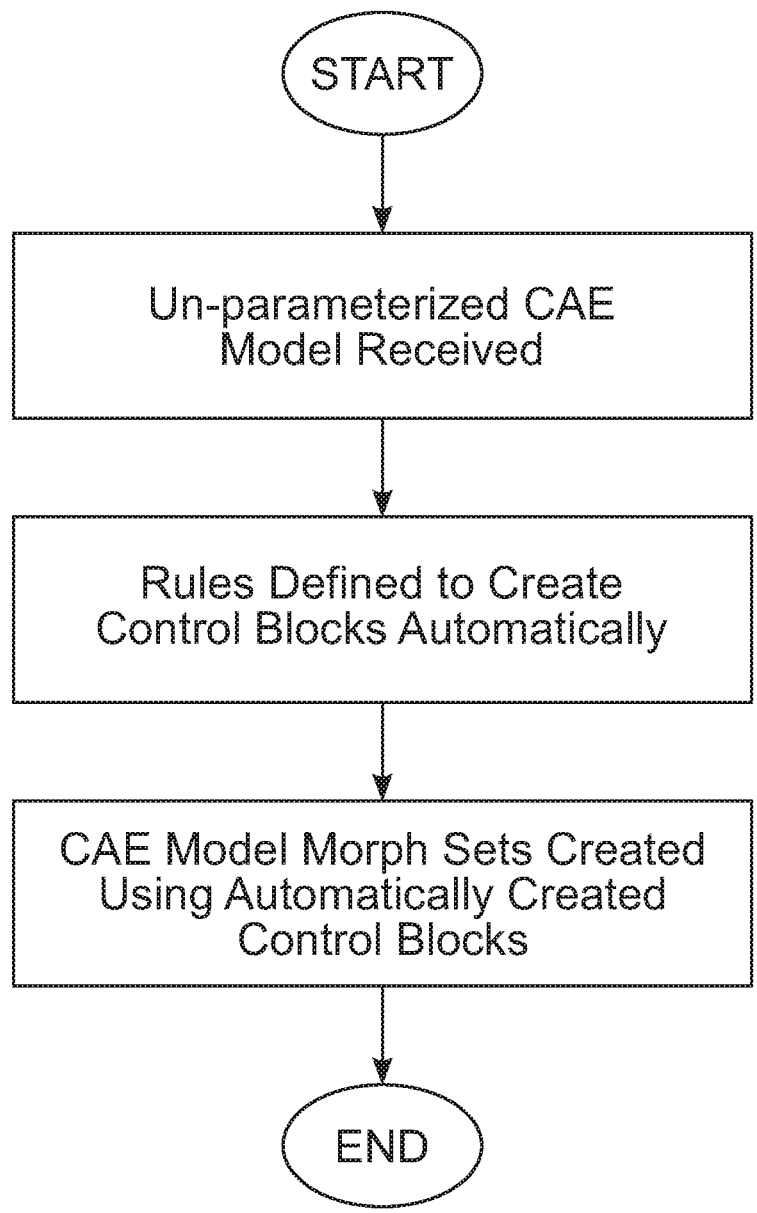
FIG. 31 is a flowchart illustrating an exemplary method for parameterizing an un-parameterized CAE model of an automated process for parametric modeling in accordance with an example embodiment.

FIG. 31 illustrates an exemplary method for parameterizing an element model 20 comprised of an un-parameterized CAE model. Rules 52 may be defined to create control blocks automatically by the computer system 100. The CAE model morph sets may be created using the automatically created control blocks based on the rules 52.

Unless otherwise defined, all technical and scientific terms used herein have the same meaning as commonly understood by one of ordinary skill in the art to which this invention belongs. Although methods and materials similar to or equivalent to those described herein can be used in the practice or testing of the automated process for parametric modeling, suitable methods and materials are described above. All publications, patent applications, patents, and other references mentioned herein are incorporated by reference in their entirety to the extent allowed by applicable law and regulations. The automated process for parametric modeling may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

What is claimed is:

1. A method for automatically generating a parametric model by a computer system, comprising:
   receiving an un-parameterized element model comprising a plurality of elements by the computer system;
   identifying one or more geometric features of the un-parameterized element model by the computer system;
   receiving one or more rules for identifying the one or more geometric features of the un-parameterized element model by the computer system, wherein the one or more rules comprises identifying the one or more geometric features exhibiting a high stress load;
   automatically creating one or more control blocks based on the one or more rules by the computer system;
   automatically creating a parametric model including a morph set from the un-parameterized element model based on the one or more geometric features of the un-parameterized element model by the computer system, wherein the morph set is created based on one or more inherited properties of the un-parameterized element model and the one or more control blocks;
   identifying a selection of the one or more geometric features exhibiting a high stress load of the parametric model by the computer system;
   receiving one or more parameters for modifying the one or more geometric features that have been identified by the computer system; and
   modifying the one or more geometric features based on the one or more parameters by the computer system by thickening the one or more geometric features exhibiting a high stress load of the parametric model.

2. The method of claim 1, wherein the un-parameterized element model comprises a computer-aided-design model.

3. The method of claim 1, wherein the parametric model comprises a finite element model.

4. The method of claim 1, comprising displaying an interface for modifying the one or more geometric features by the computer system.

5. The method of claim 4, wherein the interface comprises a slider, wherein the slider is adapted to adjust the one or more parameters being applied to modify the one or more geometric features of the parametric model.

6. The method of claim 1, wherein the one or more parameters are selected from a group consisting of width, depth, length, thickness, radius, diameter, and height.

7. The method of claim 6, wherein the one or more geometric features comprise a hole.

8. The method of claim 1, wherein the plurality of elements comprise an assembly of parts.

9. The method of claim 1, comprising the step of applying a mesh to the un-parameterized element model by the computer system.

10. A method for automatically generating a parametric model by a computer system, comprising:
    receiving an un-parameterized element model comprising a plurality of elements by the computer system;
    applying a mesh to the un-parameterized element model by the computer system;
    receiving one or more rules for automatically creating one or more control blocks of one or more geometric features of the un-parameterized element model by the computer system, wherein the one or more rules comprises identifying the one or more geometric features exhibiting a high stress load;
    automatically creating morph sets based on the one or more control blocks, the un-parameterized element model, and one or more inherited properties of the un-parameterized element model by the computer system;
    automatically creating a parametric model from the un-parameterized element model based on the one or more geometric features of the un-parameterized element model by the computer system;
    identifying a selection of the one or more geometric features exhibiting a high stress load of the parametric model by the computer system;
    receiving one or more parameters for modifying the one or more geometric features that have been selected by the computer system; and
    modifying the one or more geometric features based on the one or more parameters by the computer system by thickening the one or more geometric features exhibiting a high stress load of the parametric model.

11. The method of claim 10, comprising the step of storing the one or more rules.

12. The method of claim 10, wherein the one or more parameters are selected from a group consisting of width, depth, length, thickness, radius, diameter, and height.

13. The method of claim 12, wherein the one or more geometric features are selected from a group consisting of a hole, a rib, a fillet, and a flange.

14. A method for automatically generating a parametric model by a computer system, comprising:
    receiving an un-parameterized computer-aided engineering model comprising one or more parts having a plurality of elements by the computer system;
    applying a mesh to the un-parameterized computer-aided engineering model by the computer system;
    receiving one or more rules for identifying one or more geometric features of the un-parameterized computer-aided engineering model by the computer system, wherein the one or more rules comprises identifying the one or more geometric features exhibiting a characteristic;
    automatically creating one or more control blocks of the one or more geometric features exhibiting the characteristic by the computer system;
    identifying one or more geometric features of the un-parameterized computer-aided engineering model exhibiting the characteristic based on the one or more rules by the computer system;

automatically creating morph sets based on the control blocks, the un-parameterized element model, and one or more inherited properties of the un-parameterized element model by the computer system;

automatically creating a parametric model from the un-parameterized computer-aided engineering model based on the one or more geometric features of the un-parameterized computer-aided engineering model by the computer system;

identifying a selection of the one or more geometric features of the parametric model by the computer system;

receiving one or more parameters for modifying the one or more geometric features that have been selected by the computer system; and modifying the one or more geometric features based on the one or more parameters and the characteristic by the computer system.

15. The method of claim 14, wherein the characteristic is selected from a group consisting of width, depth, length, thickness, radius, diameter, and height.

16. The method of claim 14, comprising the step of carrying forward the plurality of elements from the un-parameterized computer-aided engineering model to the parametric model by the computer system.

* * * * *